United States Patent
Noda et al.

(10) Patent No.: US 6,999,353 B2
(45) Date of Patent: *Feb. 14, 2006

(54) SEMICONDUCTOR MEMORY DEVICE INCLUDING PAGE LATCH CIRCUIT

(75) Inventors: Junichiro Noda, Kanagawa-ken (JP); Tamio Ikehashi, Kanagawa-ken (JP); Kenichi Imamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/968,303

(22) Filed: Oct. 20, 2004

(65) Prior Publication Data

US 2005/0052930 A1    Mar. 10, 2005

Related U.S. Application Data

(60) Continuation of application No. 10/751,463, filed on Jan. 6, 2004, now Pat. No. 6,826,116, which is a division of application No. 10/270,673, filed on Oct. 16, 2002, now Pat. No. 6,731,538, which is a continuation-in-part of application No. 09/794,076, filed on Feb. 28, 2001, now abandoned.

(30) Foreign Application Priority Data

Mar. 10, 2000  (JP)  ............................. 2000-066954

(51) Int. Cl.
*G11C 7/00*      (2006.01)
*G11C 29/00*     (2006.01)
*G11C 8/00*      (2006.01)

(52) U.S. Cl. ............... 365/189.05; 365/201; 365/238.5

(58) Field of Classification Search ........... 365/189.05, 365/201, 238.5, 185.04, 185.09, 185.12, 365/200

See application file for complete search history.

(56) References Cited

U.S. PATENT DOCUMENTS

| | | | |
|---|---|---|---|
| 5,291,584 A | | 3/1994 | Challa et al. |
| 5,485,428 A | * | 1/1996 | Lin ......................... 365/238.5 |
| 5,642,316 A | * | 6/1997 | Tran et al. ................... 365/200 |
| 5,671,178 A | | 9/1997 | Park et al. |
| 5,754,469 A | | 5/1998 | Hung et al. |
| 5,765,185 A | * | 6/1998 | Lambrache et al. ... 365/189.05 |
| 5,835,414 A | | 11/1998 | Hung et al. |
| 5,999,451 A | | 12/1999 | Lin et al. |
| 6,055,189 A | * | 4/2000 | Ogane ................... 365/185.11 |
| 6,201,736 B1 | | 3/2001 | Komatsu |

(Continued)

FOREIGN PATENT DOCUMENTS

| | | |
|---|---|---|
| JP | 03-08700 | 4/1991 |
| JP | 05-282882 | 10/1993 |

(Continued)

*Primary Examiner*—Trong Phan
(74) *Attorney, Agent, or Firm*—Oblon, Spivak, McClelland, Maier & Neustadt PC

(57) ABSTRACT

A semiconductor memory device having a data latch circuit has plural bit lines to which a reprogrammable memory cell is connected, a data bus on which data is transferred, a latch circuit latching the data transferred on the data bus, a read out circuit connected to the data bus, and a data transfer circuit group to directly transfer the data latched in the latch circuit to the read out circuit without transferring it to the memory cell.

18 Claims, 20 Drawing Sheets

U.S. PATENT DOCUMENTS

| | | | |
|---|---|---|---|
| 6,216,180 B1 * | 4/2001 | Kendall et al. | 365/230.01 |
| 6,304,486 B1 | 10/2001 | Yano | |
| 6,331,948 B1 * | 12/2001 | Kasai et al. | 365/185.09 |
| 6,373,748 B1 * | 4/2002 | Ikehashi et al. | 365/189.05 |
| 6,385,084 B1 | 5/2002 | Tamada et al. | |

FOREIGN PATENT DOCUMENTS

| | | |
|---|---|---|
| JP | 11-110986 | 4/1999 |
| JP | 2000-127950 | 5/2000 |
| JP | 2000-149581 | 5/2000 |

* cited by examiner

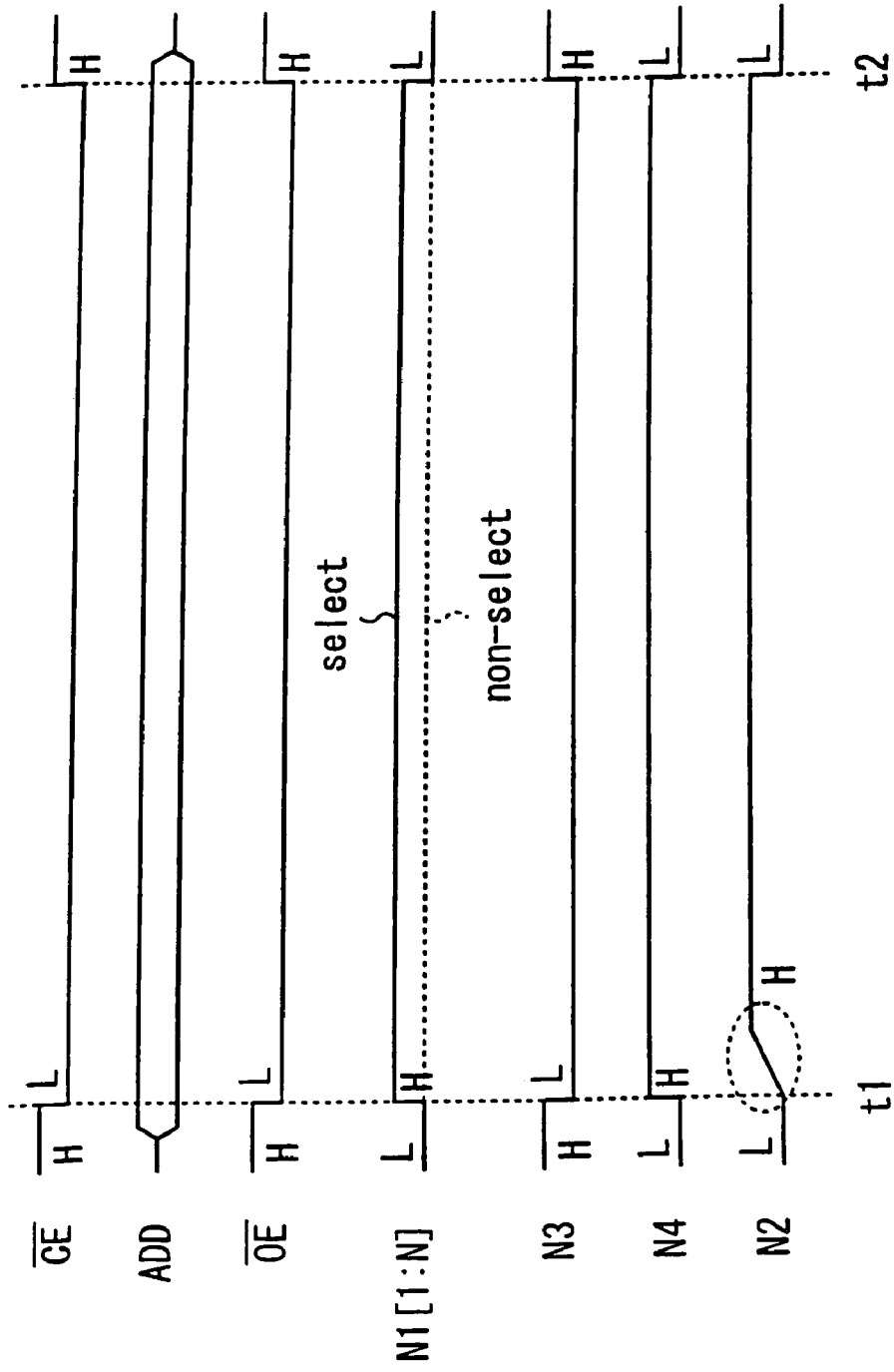

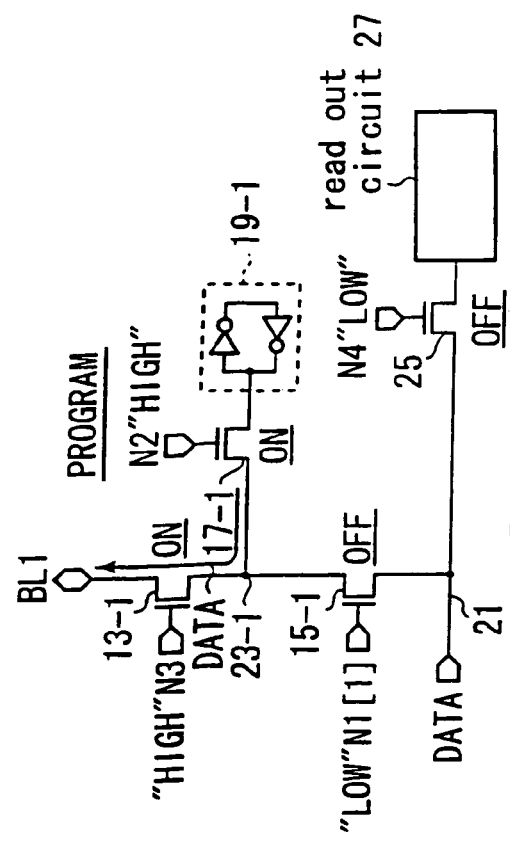
Fig. 7a DATA LOAD
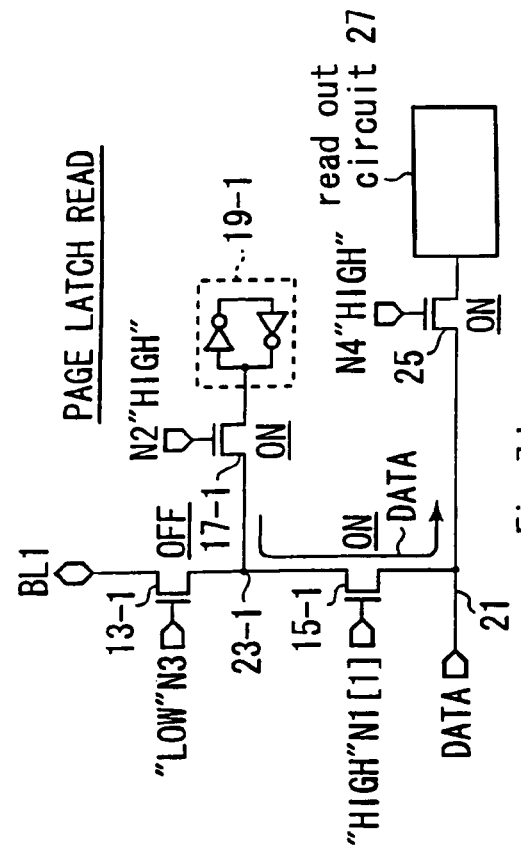
Fig. 7b PROGRAM
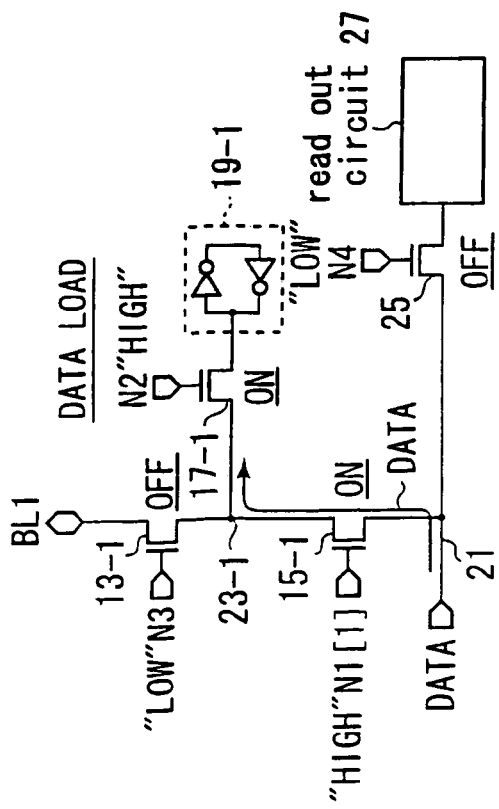
Fig. 7c READ
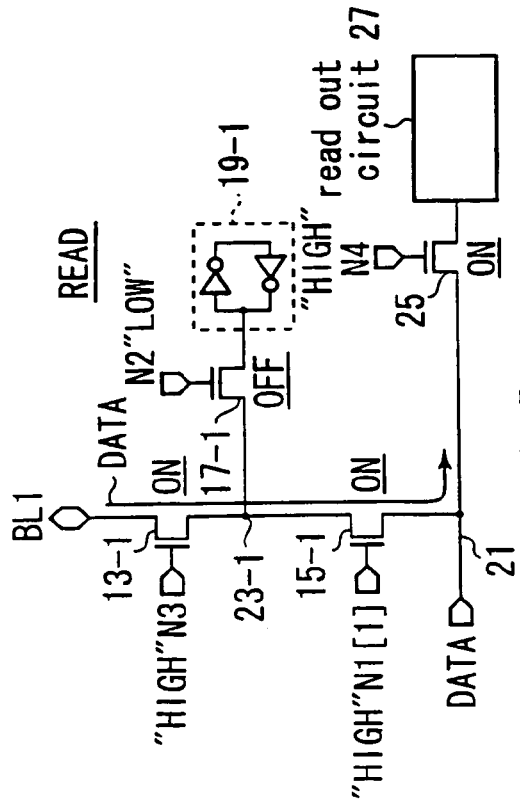
Fig. 7d PAGE LATCH READ

SEMICONDUCTOR MEMORY DEVICE INCLUDING PAGE LATCH CIRCUIT

CROSS-REFERENCE TO RELATED APPLICATIONS

This application is a continuation-in-part of U.S. application Ser. No. 09/794,076, filed Feb. 28, 2001, the entire contents of which are incorporated herein by reference.

This application is based upon and claims the benefit of priority from the prior Japanese Patent Application No.2000-066954, filed Mar. 10, 2000, the entire contents of which are incorporated herein by reference.

BACKGROUND OF THE INVENTION

1. Field of the Invention

This present invention relates to a semiconductor memory device which is reprogrammable, and particularly relates to a reprogrammable semiconductor memory device having a page latch.

2. Related Art

In some of a nonvolatile semiconductor memory device (EEPROM) which is reprogrammable by one byte to by a few tens bytes (for one page), one latch circuit (page latch circuit) for retaining one page data is provided for every bit line. In this specification, the nonvolatile semiconductor memory device is called a semiconductor memory device having a page latch.

An operation of a conventional nonvolatile semiconductor memory device having a page latch will be explained. FIGS. 18a to 18c indicate data flow diagrams at a data loading operation, at a programming operation and at a read operation in a conventional semiconductor memory device having a page latch, respectively. First of all, as shown in FIG. 18a, one-page program data are loaded to a page latch. When one-page program data are stored in the page latch, typically one page data stored in memory cells are erased.

As shown in FIG. 18b, the one-page program data in the page latch are simultaneously written to the one-page memory cells, whose previous data have been erased. Also, when a data in the memory cell is read out, as shown in FIG. 18c, a selected memory cell is connected to a read out circuit and the data is read from the selected memory cell.

However, once a data loading operation is started, the operation continues to a data erasing operation and a data programming operation automatically in the conventional nonvolatile semiconductor memory device with a page lath. Also, in the data reading out operation, the conventional nonvolatile semiconductor memory device only has a mode in which the operation reads out data programmed to the memory cell.

In such conventional nonvolatile memory devices with page latches, when a data is programmed to a memory cell and the programmed data is read out from the memory cell, and assuming that the data which is read out includes an error, it is very hard to determine whether the data which is programmed to the memory cell has included the error or the data which is read out from the memory cell was broken at the read out circuit.

Also, when you test the page latch and the read out circuit in the conventional nonvolatile semiconductor memory device, you need a very long time to test because a data is programmed to a memory cell automatically.

SUMMARY OF THE INVENTION

An object of this invention is to provide a semiconductor memory device capable of making it easy to determine a cause of an error if there is an error in reprogrammed data and carrying out a test of the page latches and the read out circuits in a short time.

In order to accomplish the above object of this invention, a semiconductor memory device related to this invention comprises a bit line to which a reprogrammable memory cell is connected, a data bus on which data is transferred, a latch circuit having latching the data transferred on the data bus, a read out circuit connected to the data bus and a data transfer circuit group has an ability to directly transfer the data latched in the latch circuit, to the read out circuit without via the memory cell.

The data transfer circuit may have a first operation mode to transfer a data loaded to the latch circuit, to the memory cell connected to the bit line, a second operation mode to a data read out from the memory cell to the read circuit and a third operation mode to directly transfer the data latched in the latch circuit, to the read circuit.

The third operation mode may be performed during a test of the semiconductor memory device.

The first and the second operation mode may be performed during a normal operation and the third operation mode is performed during a test of the semiconductor memory device.

The data transfer circuit group may have a first transfer gate, an one end of which electrically connected to the bit line, a second transfer gate, an one end of which electrically connected to an other end of the first transfer gate, a third transfer gate, an one end of which electrically connected to the one end of the first transfer gate and an other end of which electrically connected to the latch circuit and a fourth transfer gate, an one end of which electrically connected to an other end of the second transfer gate and an other end of which electrically connected to the read out circuit.

It is desirable that when a data loaded to the latch circuit is transferred to the memory cell, the first transfer gate is set to ON state, the second transfer gate is set to OFF state, the third transfer gate is set to ON state, the fourth transfer gate is set to ON state, when a data read out from the memory cell is transferred to the read out circuit, the first transfer gate is set to ON state, the second transfer gate is set to ON state, the third transfer gate is set to OFF state, the fourth transfer gate is set to ON state, when a data loaded to the latch circuit is directly transferred to the read out circuit without via the memory cell, the first transfer gate is set to OFF state, the second transfer gate is set to ON state, the third transfer gate is set to ON state, the fourth transfer gate is set to ON state.

A voltage of a gate electrode of the third transfer gate may be gradually raised to set to ON state.

It may be desirable that when a data loaded to the latch circuit is transferred to the memory cell, the first transfer gate is set to ON state, the second transfer gate is set to OFF state, the third transfer gate is set to ON state, the fourth transfer gate is set to OFF state, when a data read out from the memory cell is transferred to the read out circuit, the first transfer gate is set to ON state, the second transfer gate is set to ON state, the third transfer gate is set to OFF state, the fourth transfer gate is set to ON state, when a data loaded to the latch circuit is transferred to the read out circuit, the first to the fourth transfer gate are set to ON state, the memory cell is set to non-selected state.

A voltage of a gate electrode of the third transfer gate may be gradually raised to set to ON state.

The semiconductor memory device having a data latch circuit further comprises a control circuit controlling the transfer gate group so as to achieve a first and second operation modes, the first operation mode programming a data loaded to the latch circuit, to the memory cell, the second operation mode stopping an operation after a data is loaded to the latch circuit.

The first operation mode may be performed at a normal operation, the second operation mode is performed at a testing operation.

The semiconductor memory device having a data latch circuit further comprises an error correction circuit is electrically connected to the read out circuit.

A semiconductor memory device having a data latch circuit comprise, a bit line to which a reprogrammable memory cell is connected, a data bus on which data is transferred, a latch circuit having latching the data transferred on the data bus, a read out circuit connected to the data bus and a data transfer circuit group, wherein the data transfer circuit group is controlled so as to transfer the data latched in the latch circuit, to the read out circuit without via the memory cell.

The data transfer circuit may have a first operation mode to transfer a data loaded to the latch circuit, to the memory cell connected to the bit line, a second operation mode to a data read out from the memory cell to the read circuit and a third operation mode to directly transfer the data latched in the latch circuit, to the read circuit.

The third operation mode may be performed during a test of the semiconductor memory device.

The first and the second operation mode may be performed during a normal operation and the third operation mode may be performed during a test of the semiconductor memory device.

It is desirable that the data transfer circuit group has a first transfer gate, an one end of which electrically connected to the bit line, a second transfer gate, an one end of which electrically connected to an other end of the first transfer gate, a third transfer gate, an one end of which electrically connected to the one end of the first transfer gate and an other end of which electrically connected to the latch circuit and a fourth transfer gate, an one end of which electrically connected to an other end of the second transfer gate and an other end of which electrically connected to the read out circuit.

It is desirable that when a data loaded to the latch circuit is transferred to the memory cell, the first transfer gate is set to ON state, the second transfer gate is set to OFF state, the third transfer gate is set to ON state, the fourth transfer gate is set to ON state, when a data read out from the memory cell is transferred to the read out circuit, the first transfer gate is set to ON state, the second transfer gate is set to ON state, the third transfer gate is set to OFF state, the fourth transfer gate is set to ON state, when a data loaded to the latch circuit is directly transferred to the read out circuit without via the memory cell, the first transfer gate is set to OFF state, the second transfer gate is set to ON state, the third transfer gate is set to ON state, the fourth transfer gate is set to ON state.

A voltage of a gate electrode of the third transfer gate may be gradually raised to set to ON state.

It may be desirable that when a data loaded to the latch circuit is transferred to the memory cell, the first transfer gate is set to ON state, the second transfer gate is set to OFF state, the third transfer gate is set to ON state, the fourth transfer gate is set to OFF state, when a data read out from the memory cell is transferred to the read out circuit, the first transfer gate is set to ON state, the second transfer gate is set to ON state, the third transfer gate is set to OFF state, the fourth transfer gate is set to ON state, when a data loaded to the latch circuit is transferred to the read out circuit, the first to the fourth transfer gate are set to ON state, the memory cell is set to non-selected state.

A voltage of a gate electrode of the third transfer gate may be gradually raised to set to ON state.

The semiconductor memory device having a data latch circuit further comprises a control circuit controlling the transfer gate group so as to achieve a first and second operation modes, the first operation mode programming a data loaded to the latch circuit, to the memory cell, the second operation mode stopping an operation after a data is loaded to the latch circuit.

The first operation mode may be performed at a normal operation, the second operation mode is performed at a testing operation.

The semiconductor memory device having a data latch circuit further comprises an error correction circuit is electrically connected to the read out circuit.

A test method of a semiconductor memory device comprises steps of; latching data at a page latch via a data bus on which the data are transferred, transferring the data latched in the page latch to a cell matrix for stored the data at a first mode and to a read out circuit at a second mode for testing whether or not an error occurs at a data transfer circuit group including the data bus, the page latch and read out circuit.

BRIEF DESCRIPTION OF THE DRAWINGS

FIG. 6 shows a waveform diagram which indicates a page latch reading out operation of the page latch in FIG. 2.

FIG. 7a shows a state of the page latch at a data loading operation. FIG. 7b shows a state of the page latch at a programming operation. FIG. 7c shows a state of the page latch at reading out operation. FIG. 7d shows a state of the page latch at a page latch reading out operation.

DETAILED DESCRIPTION OF THE PREFERRED EMBODIMENTS

Embodiments of the invention are explained with reference to figures, in which same numbers refer to same parts throughout the figures.

First Embodiment.

Figure 1A:
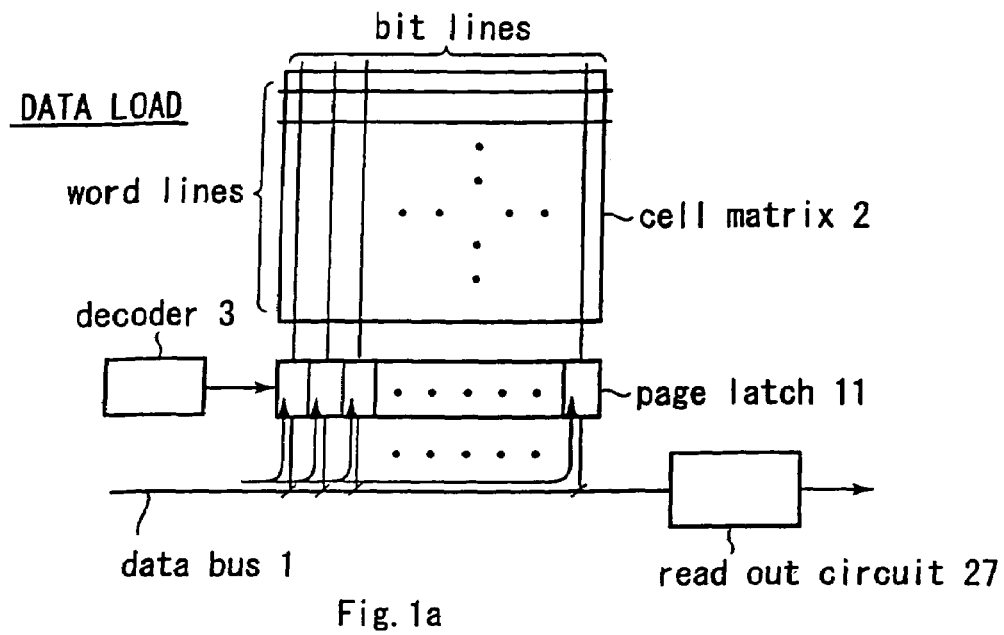
FIG. 1a and FIG. 1b show data flows respectively in a case that a semiconductor memory device of a first embodiment of this invention is set for a data loading operation and a page latch reading out operation.
Figure 1B:
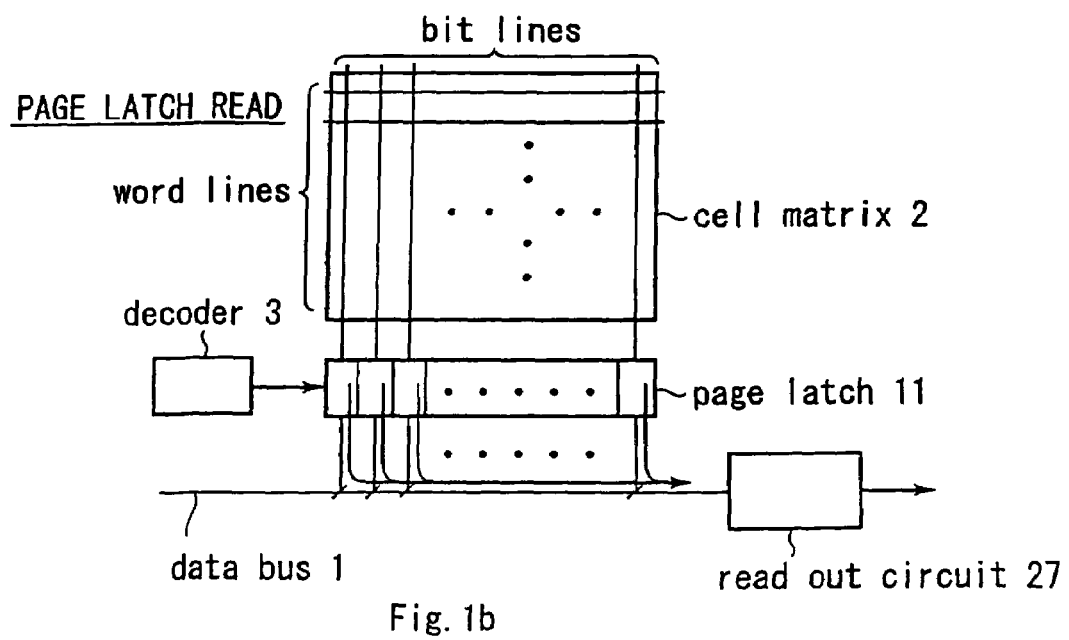

FIGS. 1a and 1b show data flows at a data loading operation and at a data reading out operation from a page latch (page latch read) of a nonvolatile semiconductor memory device of a first embodiment, respectively. As shown in FIG. 1a, one page data are loaded to a page latch 11 via a data bus 1 at the data loading operation. Then, the conventional nonvolatile semiconductor memory device, erasing of data programmed in a memory cell and programming of the loaded data follow the loading operation continuously and automatically when program data of one page are set to the page latch 11.

On the other hand, in the nonvolatile semiconductor memory device of the first embodiment of this invention, the loading operation is once stopped when program data of one page are set to the page latch 11.

After the stop of the operation, as shown in FIG. 1b, the page latch 11 is electrically separated from a cell matrix 2 and, furthermore, is electrically connected to a read out circuit 27. Thereby, the data loaded to the page latch 11 can be transferred to the read out circuit 27 directly and read out form the page latch 11 without transferring the data to the cell matrix 2.

The reading out operation, which reads out the data from the page latch 11, for instance, is carried out at a testing operation. The reading out operation can be used for an examination for separating non-defect productions from defect productions and for a defect analysis of nonvolatile semiconductor memory device, or the like.

Figure 18A:
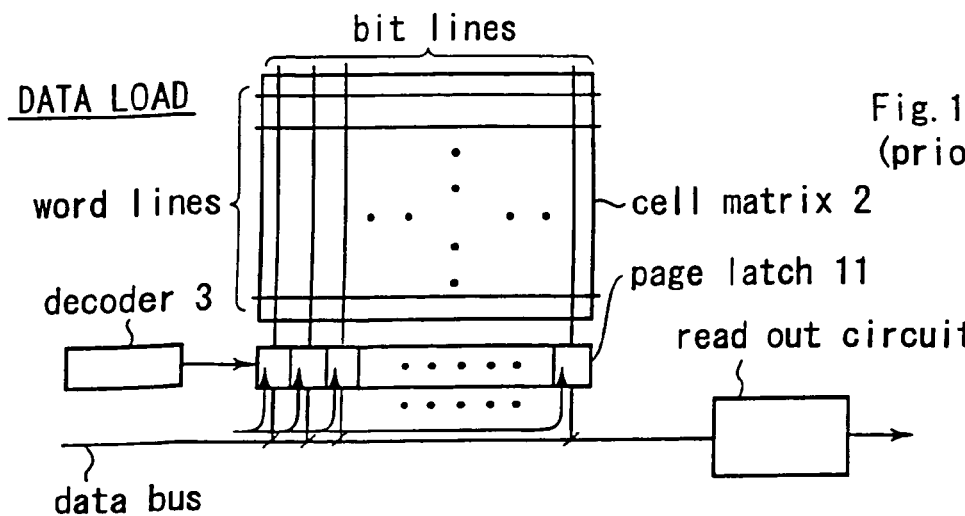
FIG. 18a to FIG. 18c show data flows at the data loading operation, the data programming operation and the data reading out operation of the conventional semiconductor memory device respectively.
Figure 18B:
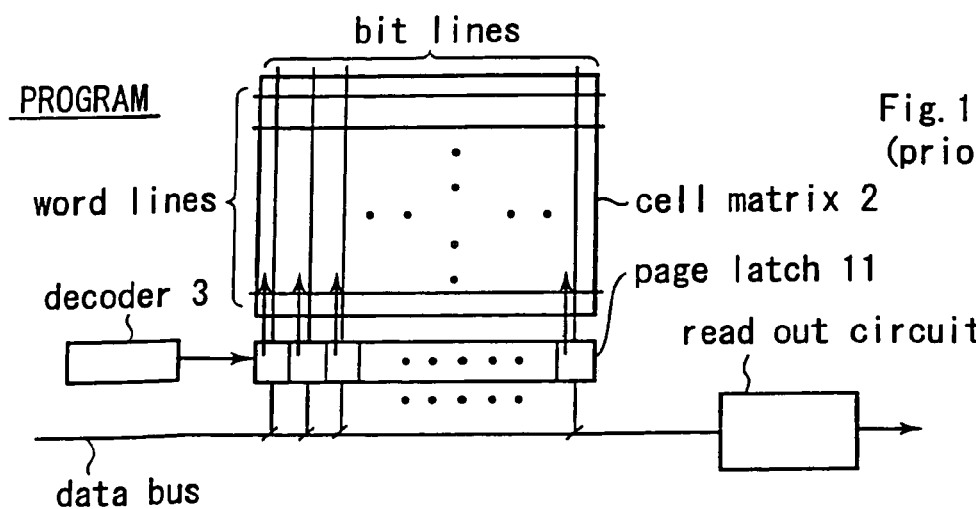
Figure 18C:
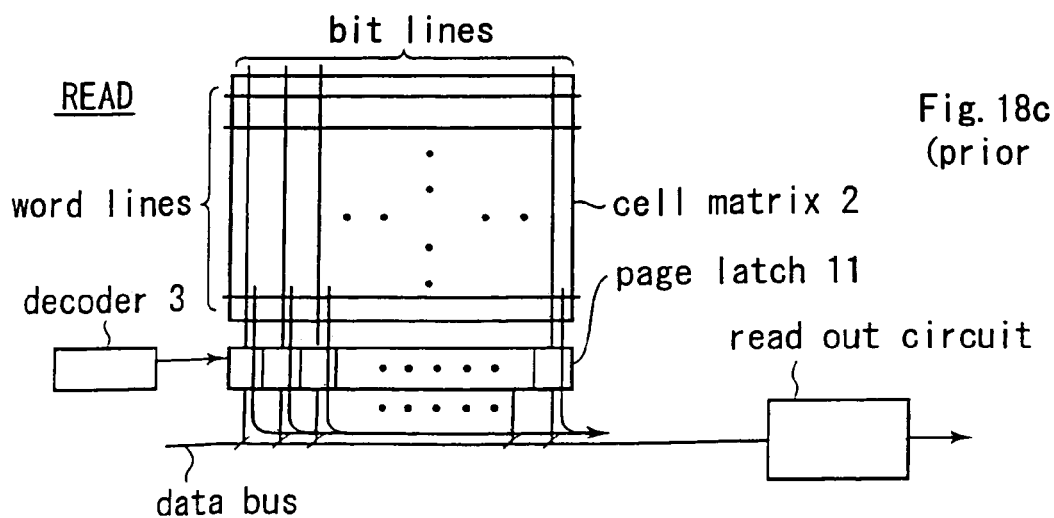

The nonvolatile semiconductor memory device of the first embodiment in this present invention can carry out operations shown in FIG. 18a to FIG. 18c at a normal operation. In other words, the nonvolatile semiconductor memory device of the first embodiment in this present invention can be used, similarly to the conventional nonvolatile semiconductor memory device at the normal mode.

Figure 2:
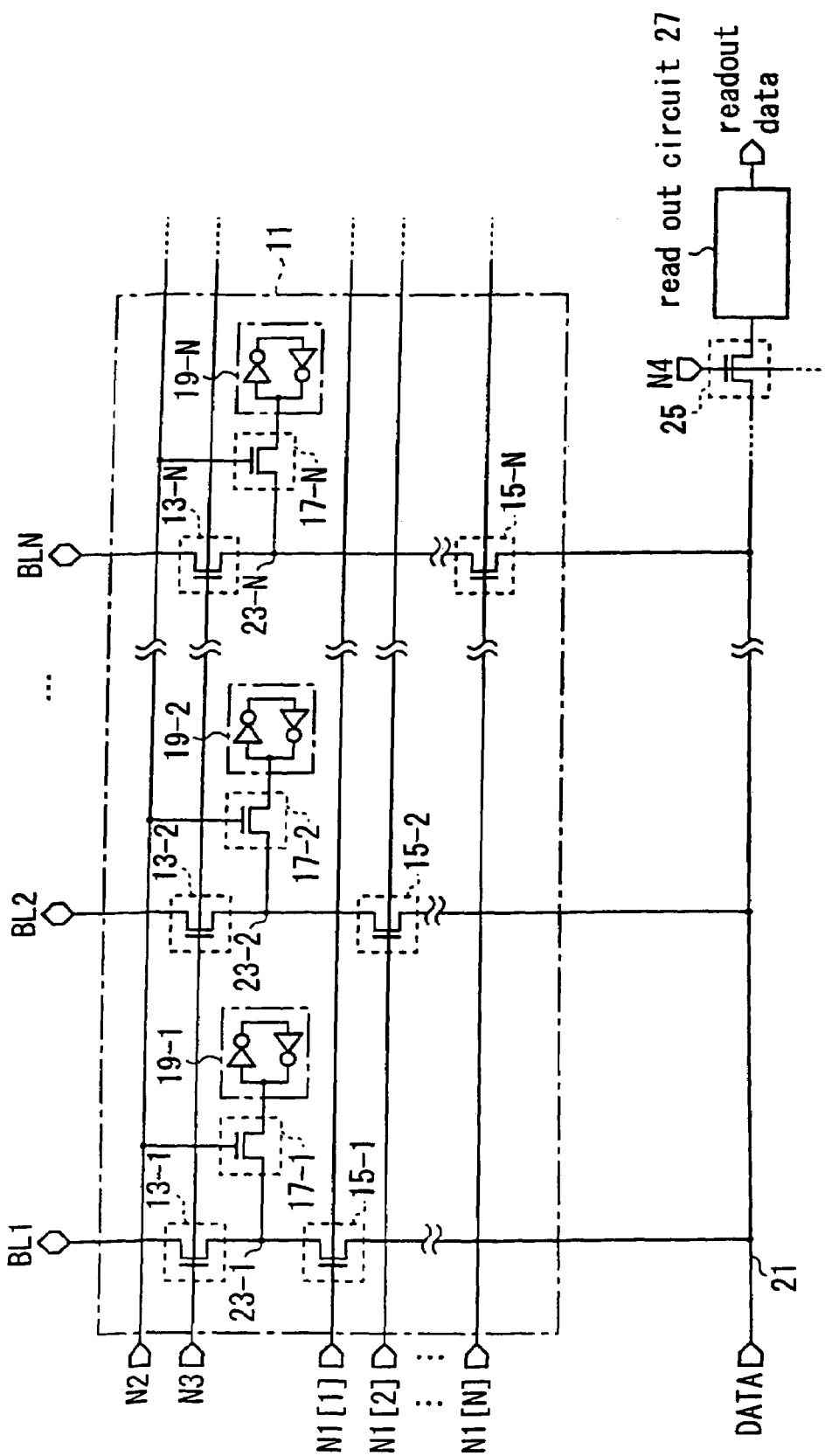
FIG. 2 shows a circuit example of a page latch which is provided in the semiconductor memory device of the first embodiment of this invention.

Next, one circuit example of the page latch 11 is described. FIG. 2 shows an exemplary circuit diagram of the page latch 11 contained in the nonvolatile semiconductor memory device of the first embodiment.

As shown in FIG. 2, the page latch 11 has first transfer gates 13-1 to 13-N, second transfer gates 15-1 to 15-N, third transfer gates 17-1 to 17-N and latch circuits 19-1 to 19-N, respectively. The first to third transfer gates comprise, for instance, MOS transistors.

Each one end of current paths of the fist transfer gates 13-1 to 13-N is connected to corresponding bit lines BL1 to BLN respectively. A transfer signal N3 is commonly supplied to control nodes of the first transfer gate 13-1 to 13-N.

Each one end of current paths of the second transfer gates 15-1 to 15-N is connected to corresponding ends of the current paths of the first transfer gates 13-1 to 13-N respectively, which are connected to a data line 21. The data line 21 is one line of the data bus 1 shown in FIGS. 1a and 1b. The data line 21 is connected to the read out circuit 27 via a fourth transfer gate 25. A transfer signal N4 is supplied to a control node of the fourth transfer gate 25. Select transfer signals N1[1] to N1[N] are supplied to the control nodes of the second transfer gates 15-1 to 15-N respectively. The select transfer signals N1[1] to N1[N] are column select signals and outputted from a decoder 3 (a column decoder) shown in FIG. 1a and FIG. 1b.

Each one end of current paths of the third transfer gates 17-1 to 17-N is connected to corresponding nodes 23-1 to 23-N respectively. Each of the nodes 23-1 to 23-N is the corresponding connection-node between the first transfer gates 13-1 to 13-N and the second transfer gates 15-1 to 15-N respectively. Each another end of current paths of the third transfer gates 17-1 to 17-N is connected to corresponding latch circuits 19-1 to 19-N respectively. A transfer signal N2 is supplied to the control nodes of the third transfer gates 17-1 to 17-N commonly.

In the above-stated circuit, each gate of the first transfer gates 13-1 to 13-N, the second transfer gates 15-1 to 15-N, the third transfer gates 17-1 to 17-N and the fourth transfer gates 25 functions as a data transfer circuit for transferring data. The data transfer circuit transfers data inputted on the data line 21 to the memory cell via the latch circuits 19-1 to 19-N and the bit lines BL1 to BLN, or transfers data via the data line 21 to the read out circuit 27.

In the page latch 11 shown in FIG. 2 the N latch circuits 19-1 to 19-N are electrically connected to one data line 21. Therefore, at the data loading, data are loaded to the page latch 11 N times. When a total of N data are latched to the latch circuits 19-1 to. 19-N, respectively, one page data are set to the page latch 19. After that, as shown in FIG. 1b, the page latch reading out operation or the data erasing and the data programming operations are carried out.

The number of the latch circuits 19-1 to 19-N provided in the page latch 11 shown in FIG. 2 may be M (an integral number) in an actual device. In this case, parallel data M×N (M parallel data, N times) are loaded to the M page latches 11 via the M data lines 21. When a total of M×N data are latched to the corresponding M×N latch circuits respectively, one page data is set in the page latches 11. After that, as shown in FIG. 1b, the page latch reading out operation, or the data erasing and the data programming operations are carried out. Next, an example of operation of page latch 11 (FIG. 2) is described.

Data Loading Operation.

Figure 3:
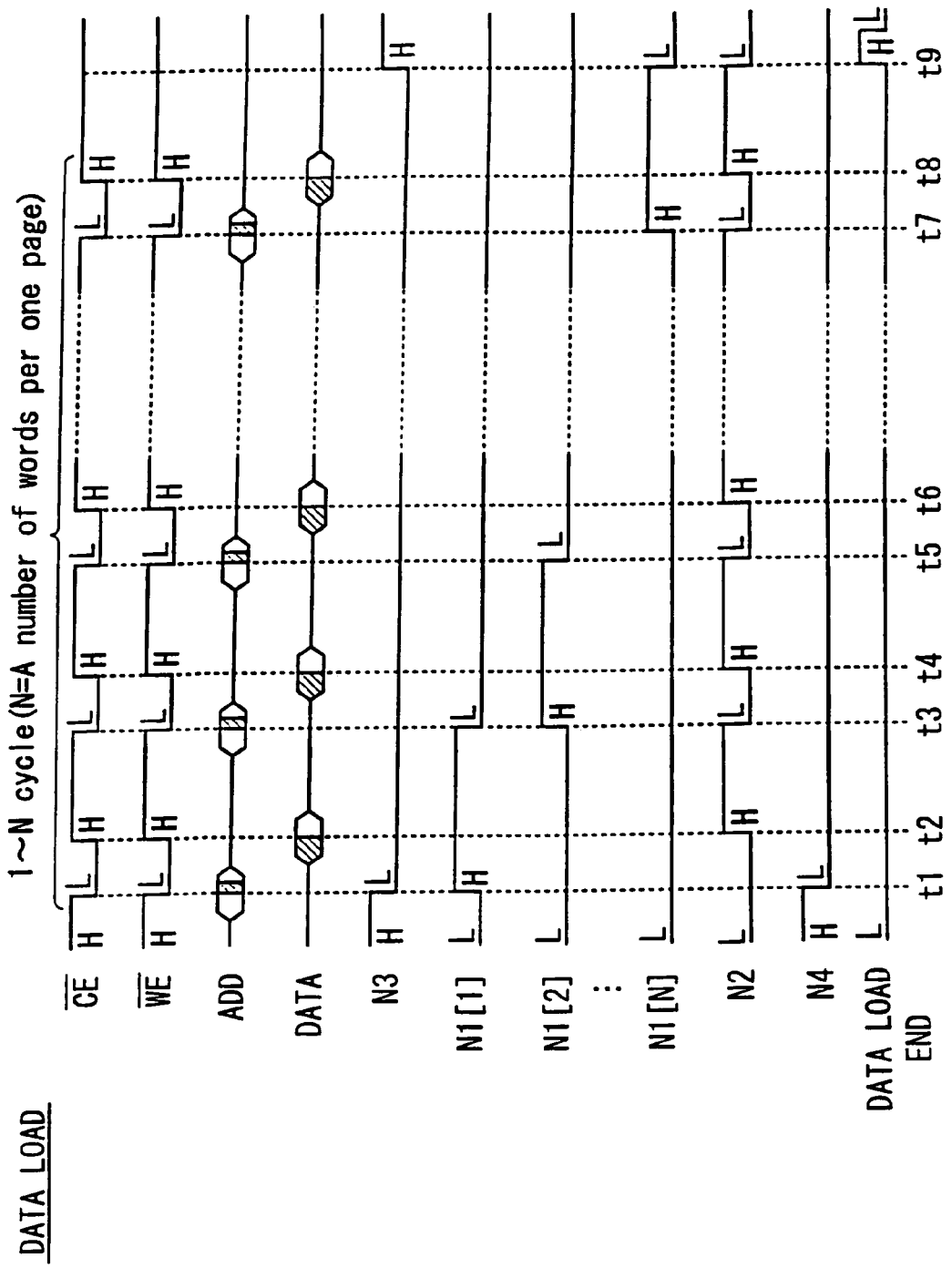
FIG. 3 shows a waveform diagram which indicates a data loading operation of the page latch in FIG. 2.

FIG. 3 shows waveform diagram s at the data loading operation of the data latch 11 shown in FIG. 2. Also, FIG. 7a shows states of the page latch 11 at the data loading operation.

As shown in FIG. 3, at a time t1, a chip enable signal /CE and a write enable signal /WE are set from High level to Low level respectively. When each of the chip enable signal /CE and the write enable signal /WE is set to Low level, the transfer signals N3 and N4 are set from High level to Low level respectively.

As a result, the first transfer gates 13-1 to 13-N and the fourth transfer gate 25 are set to OFF respectively, the page latch 11 is electrically separated from the cell matrix 2 and the read out circuit 27. When the chip enable signal /CE and the write enable signal /WE are set to Low level, an address signal ADD is inputted to the chip. As a result, typically one of the N select transfer signals N1[1] to N1[N] is selected in accordance with the inputted address signal ADD, and the selected signal (for example, the select transfer gate signal N1[1]) is set from Low level to High level. This causes the second transfer gate 15-1 to turn ON, and the data DATA is transferred from the data line 21 to the connection node 23-1.

Next, at a time t2, a transfer signal N2 is set to High level, thereby forcing the third transfer gates 17-1 to 17-N to turn ON respectively. As a result, as shown in FIG. 7a, the data DATA is transferred to the latch circuit 19-1 from the data line 21 via the connection node 23-1, and latched by the latch circuit 19-1.

Same operations are repeated from times t3 to t8. Thereby, the data DATA are transferred to all of the latch circuits 19-1 to 19-N and the N data are latched to the corresponding latch circuits 19-1 to 19-N respectively. And at a time t9, a DATA LOAD END signal is set to High level contemporarily, thereby finishing the data loading operation.

Programming Operation.

Figure 4:
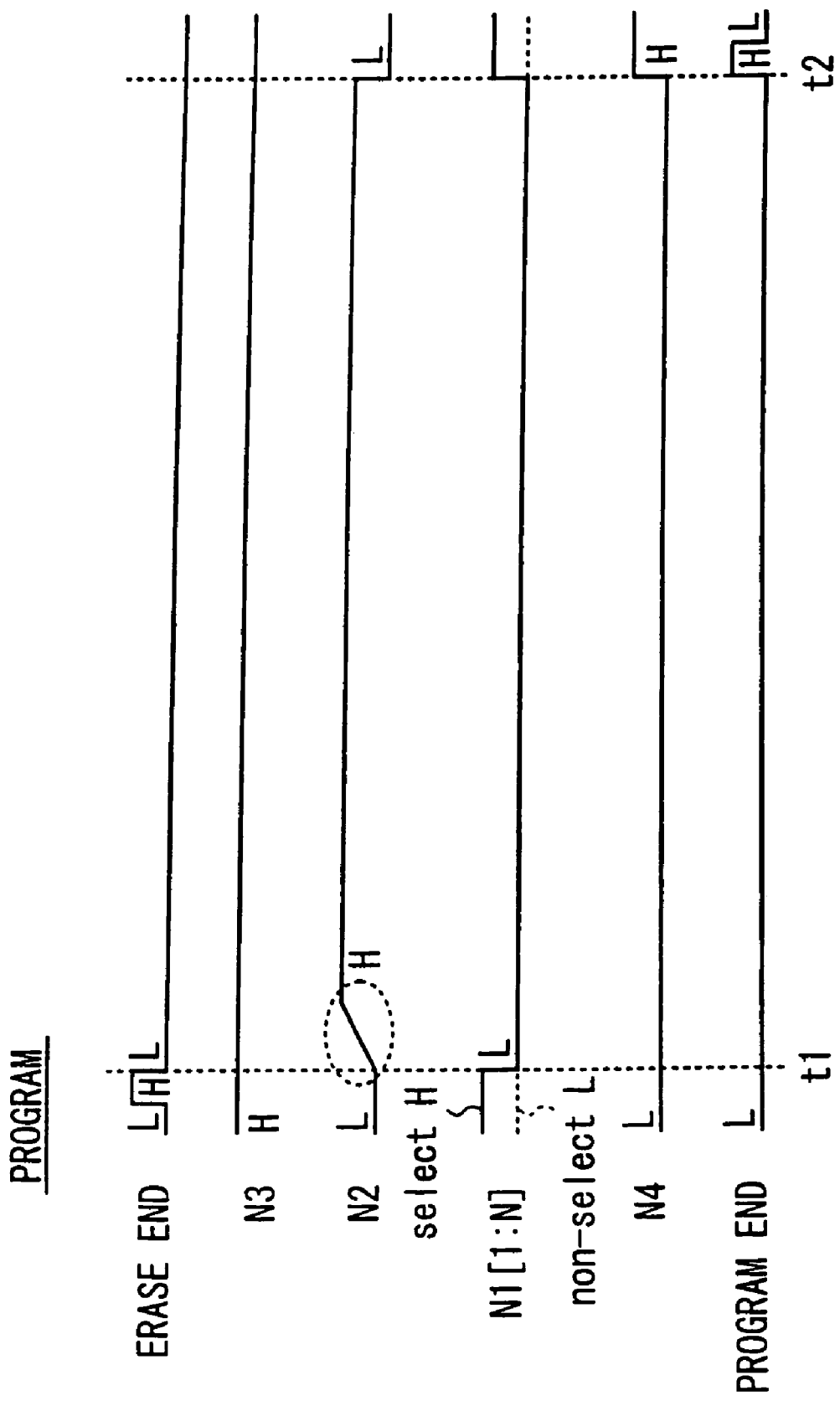
FIG. 4 shows a waveform diagram which indicates a programming operation of the page latch in FIG. 2.

The programming operation is carried out after the erasing operation. FIG. 4 shows waveform diagrams of the programming operation of the page latch 11 illustrated in FIG. 2. FIG. 7a shows a diagram illustrating a state of the page latch 11 at the programming operation. As shown in FIG. 4, first of all, at a time t1, a signal ERASE END indicated to an end of the erasing operation is set to High level to Low level. Thereby, all of the select transfer signals N1[1] to N1[N] are set to Low level. And the transfer signal N3 remains at High level.

As a result, the page latch 11 is electrically connected to the cell matrix 2 and separated from the data line 21. Also, the transfer signal 2 slowly changes from at Low level to High level in order to prevent the data from destruction by a charge sharing. This, as shown in FIG. 7b, allows each of the data DATA latched in the latch circuits 19-1 to 19-N to be slowly transferred to the bit lines BL1 to BLN and to be programmed to the memory cells (not shown in FIG. 7a) connected to bit lines BL1 to BLN respectively. Next, at a time t2, the transfer signal N2 is set from High level to Low level. The PROGRAM END signal is set to High level contemporarily and the programming operation is finished.

Figure 8A:
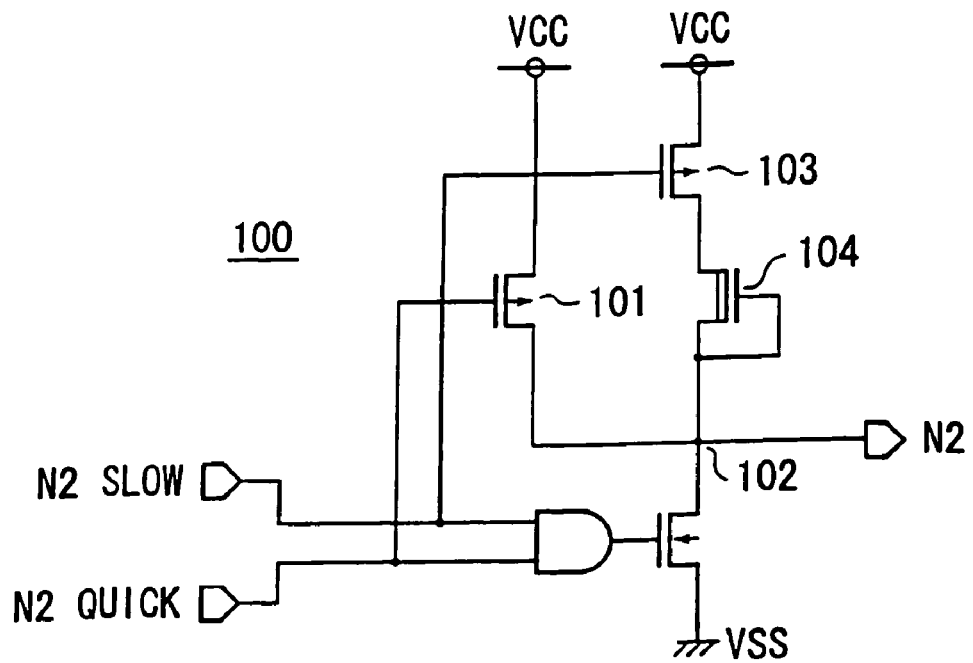
FIG. 8a and FIG. 8b show a circuit diagram of a control circuit to control a transfer signal N2.
Figure 8B:
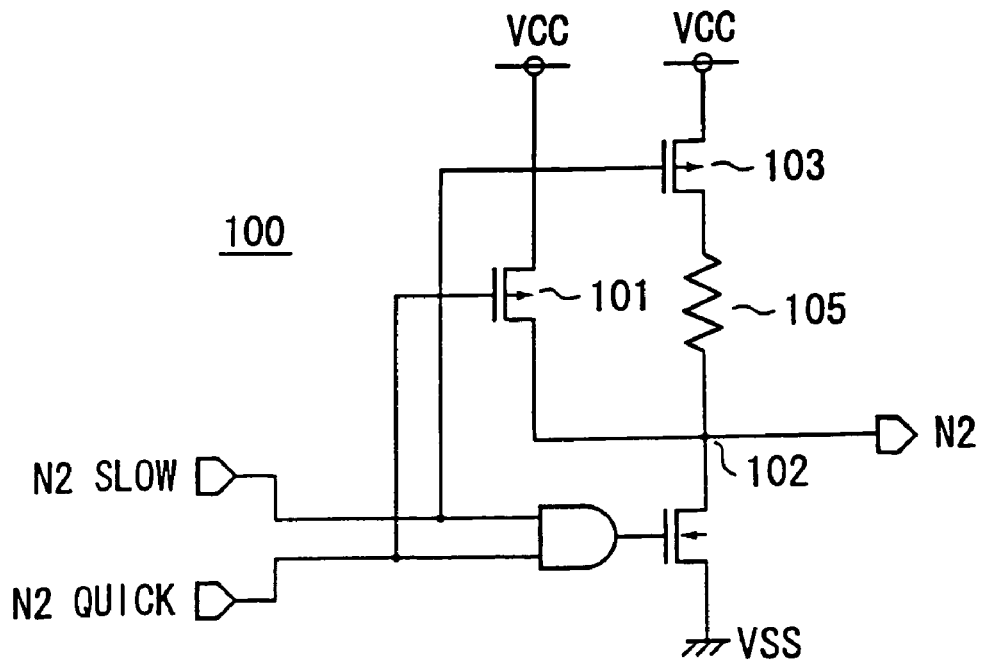

FIG. 8a and FIG. 8b show circuit examples of the control circuits to control the transfer signal N2 (hereafter, which are called N2 control circuits). As shown in FIGS. 8a and 8b, transfer signals N2 SLOW and N2 QUICK are inputted to the N2 control circuit 100. At the data loading operation, the transfer signal N2 QUICK is set to Low level. Thereby, a output node 102 is sharply charged from a voltage supply VCC via a transistor PMOS 101. On the other hand, at the programming operation or the after-stated page latch reading out operation, the transfer signal N2 SLOW is set to Low level. Thereby, the output node 102 is slowly charged from the voltage supply VCC via a depletion type NMOS 104 and a PMOS resistor 103 or resistance 105. These allow the transfer signal N2 to be slowly changed from Low level to High level.

In order to prevent the data from destruction by the charge sharing, an inverter circuit can be located between the latch circuits 19-1 to 19-N and the third transfer gates 17-1 to 17-N, other than the transfer signal N2 being made to change slowly from Low level to High level. But in view of high integration, it is more preferable that the transfer signal N2 is made to change slowly from Low level to High level than that the inverter circuit is located between the latch circuits 19-1 to 19-N and the third transfer gates 17-1 to 17-N.

Reading Out Operation.

Figure 5:
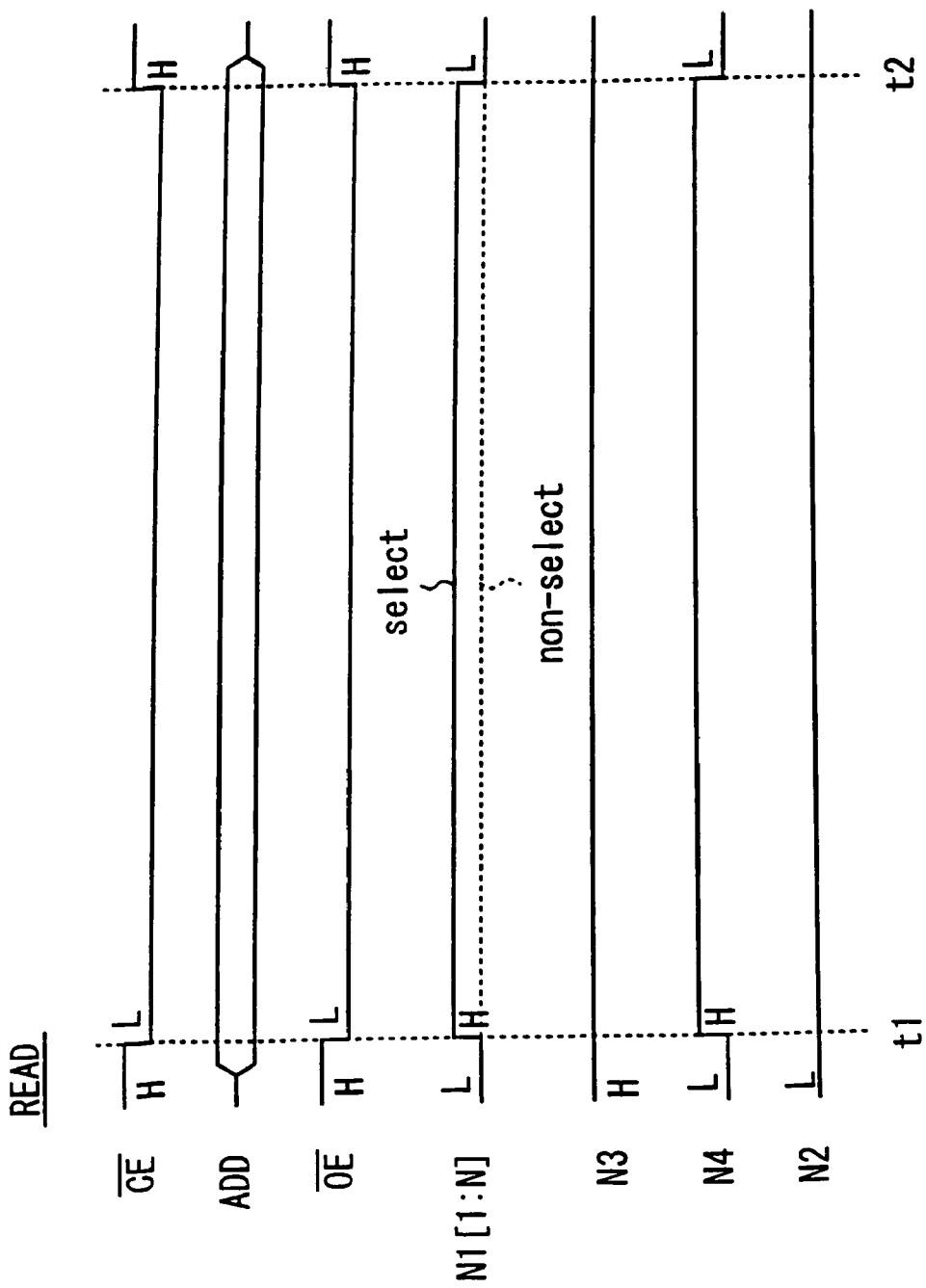
FIG. 5 shows a waveform diagram which indicates a reading out operation of the page latch in FIG. 2.

As shown in FIG. 5, first of all, at a time t1, each of the chip enable signal /CE and the output enable signal /OE are set from High level to Low level, thereby allowing the signal N4 to be set from Low level to High level. Also, the signal N3 remains at High level and the signal N2 remains at Low level.

As a result, the page latch 11 is electrically connected to the cell matrix 2 and the data line 21 is electrically connected to the read out circuit 27 (see FIG. 2). This allows data DATA stored in the memory cell to be transferred to the connection nodes 23-1 to 23-N via the bit lines BL1 to BLN. After that, when the chip enable signal /CE and the output enable signal /OE are set to Low level respectively, the address signal ADD is inputted to the chip. As a result, by the address signal ADD, one of the N select transfer signals N1[1] to N1[N] is selected typically, and the selected one of the select transfer signals is set from Low level to High level. Thereby, as shown in FIG. 7c, a selected one of the bit lines BL1 to BLN (for example, BL1 in FIG. 7c) is connected to the data line 21 via the connection node 23-1, and the data DATA stored in the memory cell is transferred to the read out circuit 27, and the data DATA which is transferred to the read out circuit 27 is outputted from the read out circuit 27 as a read out data.

Next, at a time t2, the chip enable signal /CE and the output enable signal /OE are set from Low level to High level respectively. Thereby the transfer signal N4 is set from High level to Low level, and the reading out operation is over.

Page Latch Reading Operation.

FIG. 6 shows a waveform diagram which indicates a page latch reading out operation illustrated in FIG. 2. And FIG. 7d shows a state diagram of the page latch 11 at the page latch reading out operation.

As shown in FIG. 6, first of all, at a time t1, similar to the reading out operation, the chip enables signal /CE and the output enable signal /OE are set from High level to Low level respectively. Thereby, at the page latch reading out operation, the signal N4 is set from Low level to High level, and the signal N3 is set from High level to Low level.

As a result, the first transfer gates 13-1 to 13-N turn OFF, the page latch 11 is electrically separated from the cell matrix 2. Also, the fourth transfer gate 25 turns ON. The data line 21 is electrically connected to the read out circuit 27. Furthermore, the signal N2 slowly changes from at Low level to High level. This allows data latched in the latch circuit 19-1 to 19-N to be slowly transferred to the connection nodes 23-1 to 23-N. After that, similar to the reading out operation, when the chip enable signal /CE and the output enable signal /OE are set to Low level respectively, the address signal ADD is inputted into the chip. Thereby, by the address signal ADD, one of the N select transfer signals N1[1] to N1[N] is selected typically, and the selected one of the select transfer signals is set from Low level to High level. As a result, as shown in FIG. 7d, a selected one of the latch circuits 19-1 to 19-N (for example, a latch circuit 19-1 in FIG. 7c) is connected to the data line 021 via the connection node 23-1., and the data DATA latched in the memory cell is transferred to the read out circuit 27, and the data DATA which transferred to the read out circuit 27 is outputted from the read out circuit 27 as a read out data.

Next, at a time t2, the chip enable signal /CE and the output enable signal /OE are set from Low level to High level respectively. Thereby the transfer signal N3 is set from Low level to High level, and the signal N2 and N4 are set from High level to Low level respectively, then the page latch reading out operation is over.

Another type of the page latch reading out operation is now described. The page latch reading out operation which is explained with reference to FIG. 6 and FIG. 7 is carried out at the state where the first transfer gates 13-1 to 13-N are set to be OFF and the page latch 11 is electrically separated from the cell matrix 2. However, the page latch reading out operation also may be carried out at a state where the page latch 11 is electrically connected to the cell matrix 2. Hereinafter, another type of the page latch reading out operation is described.

Figure 9:
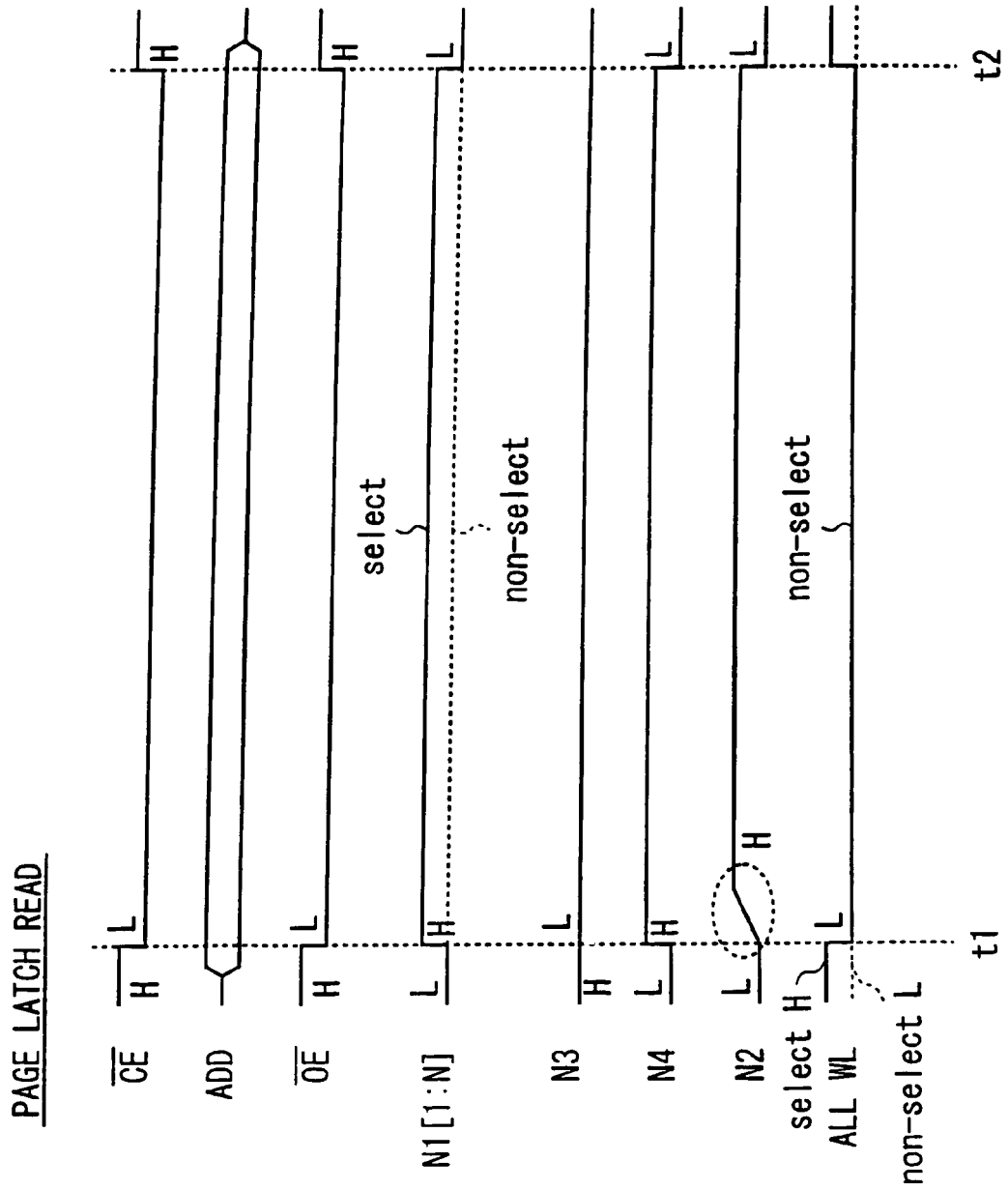
FIG. 9 shows a waveform diagram which indicates another page latch reading out operation of a page latch in FIG. 2.
Figure 10B:
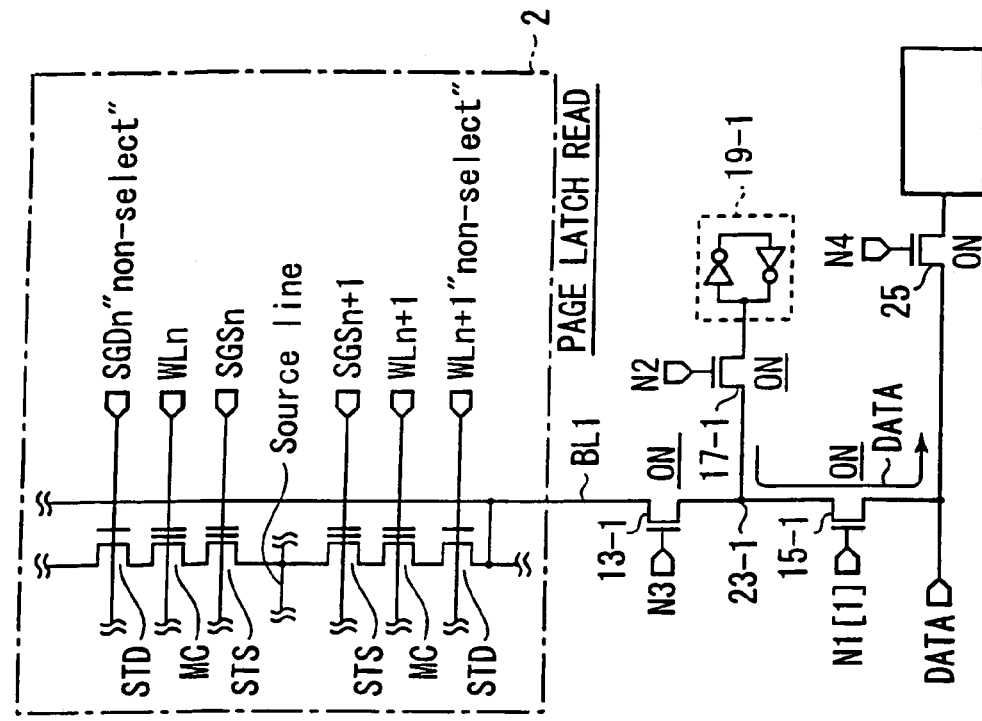
FIG. 10b shows a circuit diagram of a three-transistor type nonvolatile semiconductor memory device.
Figure 10A:
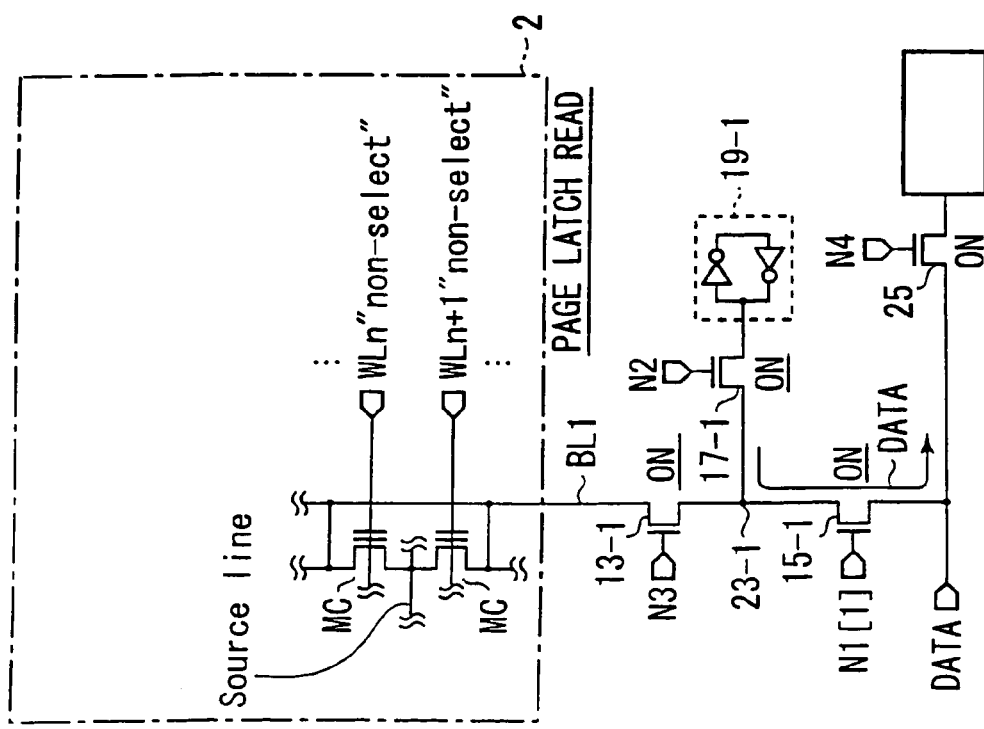
FIG. 10a shows a circuit diagram of a NOR type nonvolatile semiconductor memory device.

FIG. 9 shows a waveform diagram of another page latch reading out operation of the page latch 11 illustrated in FIG. 2. Also, FIG. 10a shows a state diagram of the page latch 11 at this another type of the page reading out operation. As shown in FIG. 9 and FIG. 10, this another type of the page latch reading out operation differs from the page latch reading out operation which is explained with reference to FIG. 6 and FIG. 7d, in the viewpoint that the memory cell is set to be non-selected state, while in the latter type of the latch reading out operation the signal N3 remains at High level and the first transfer gates 13-1 to 13-N are ON.

With the memory cell MC being at non-selected state, even if the first transfer gates 13-1 to 13-N are at ON state, the data stored in the memory cell is not transferred to the bit lines BL1 to BLN. Therefore, the data latched in the latch circuits 19-1 to 19-N can be transferred to the connection nodes 23-1 to 23-N. As described above, in this another type of the page latch reading out operation, the data DATA latched in the latch circuits 19-1 to 19-N can be transferred to the read out circuit 27.

In order to set the memory cell to be non-selected state, there are some ways in accordance with a type of nonvolatile memory cell, which are grouped into two types whether the nonvolatile memory has a select transistor or not.

FIG. 10a shows a general NOR type nonvolatile memory cell. The NOR type nonvolatile memory cell does not have a select transistor. In this type of a nonvolatile memory cell, in order to set the memory cell MC to be non-selected, it is necessary to set all of the word lines WL in the cell matrix 2 to be at a non-select voltage which is typically 0 V. Also, FIG. 10b shows a three-transistor type nonvolatile memory. The three-transistor type nonvolatile memory cell has a select transistor STD connected to a bit line and a select transistor STS connected to a source line. In this type of a nonvolatile memory cell, in order to set the memory cell MC to be non-selected, it is necessary to set all the select transistors STD connected to the bit line or all the select transistors STS connected to the source line in the cell matrix 2, to be non-select voltage which is typically 0V.

With the memory cell MC being at non-selected state, even if the first transfer gates 13-1 to 13-N are ON state, the data stored in the memory cell MC is not transferred to the bit lines BL1 to BLN.

Figure 11:
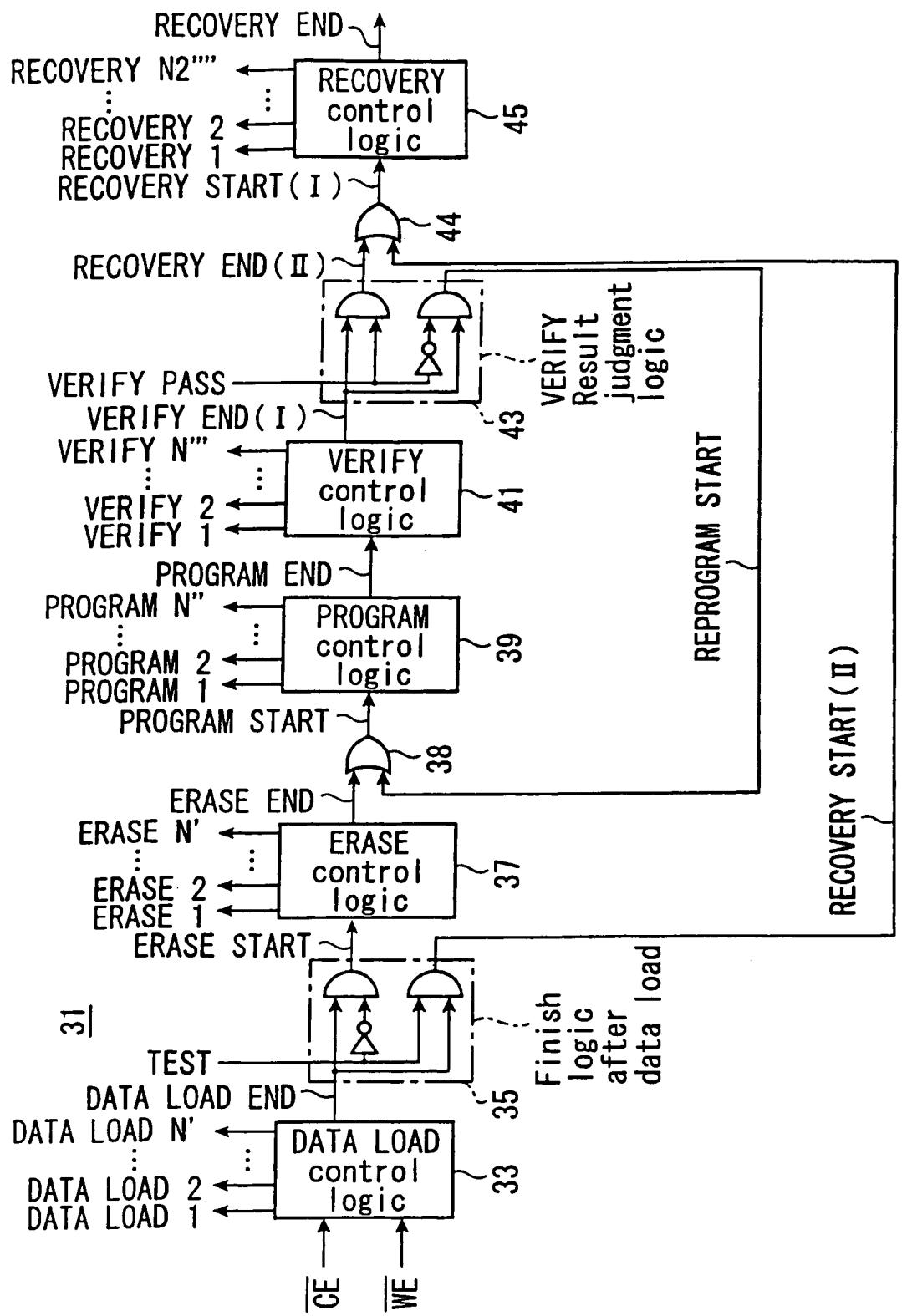
FIG. 11 shows a block diagram of one example of the control circuit.

Next, an example of a control circuit to control the nonvolatile semiconductor memory device of the first embodiment with operations thereof, is now described. FIG. 11 shows a block diagram illustrating one example of the control circuit. FIG. 11 specifically shows a block diagram of a control circuit to control from the data loading operation to the data programming operation.

Normal Operation.

Figure 12:
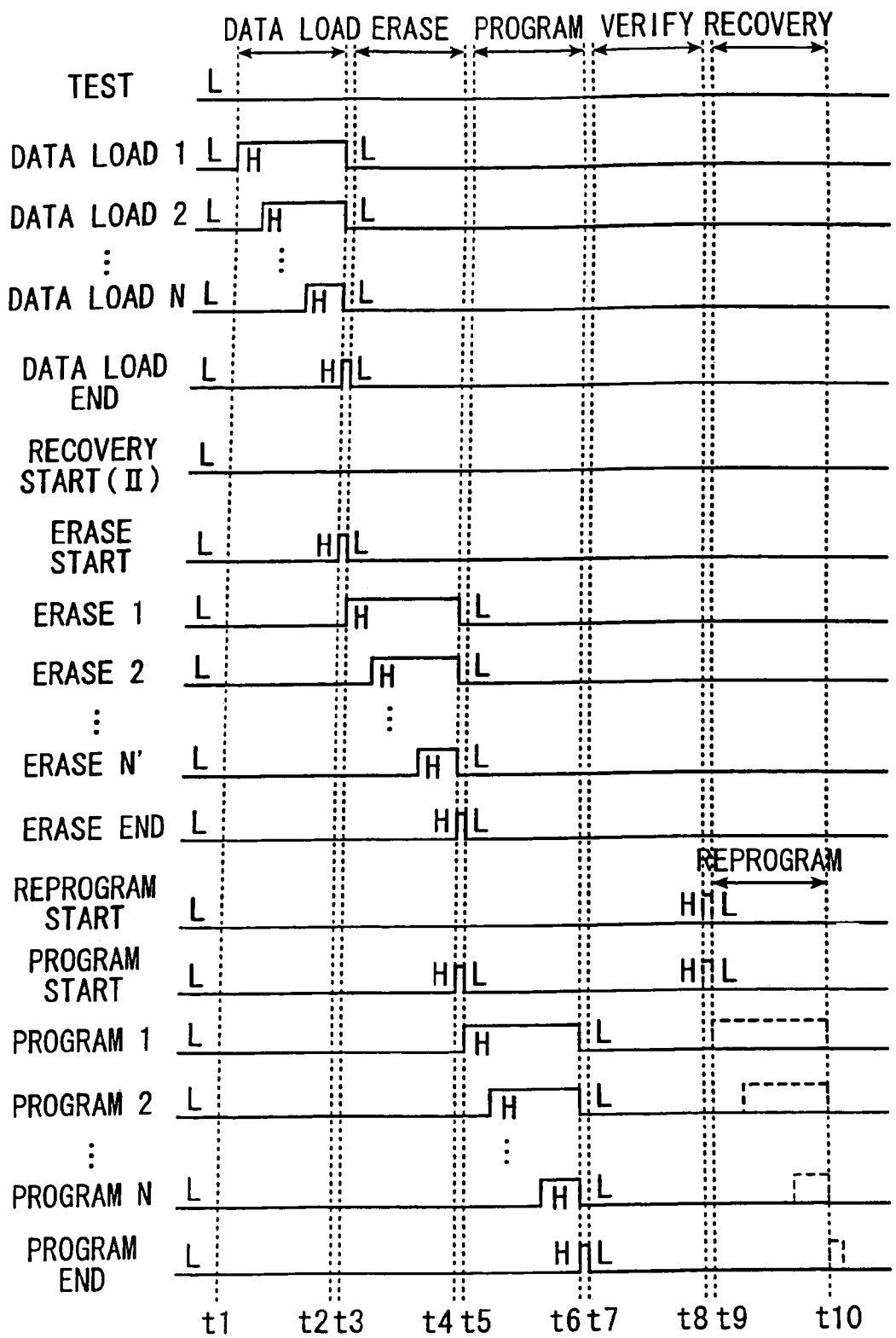
FIG. 12 shows a waveform diagram, which indicates a normal operation of the control circuit in FIG. 11.
Figure 13:
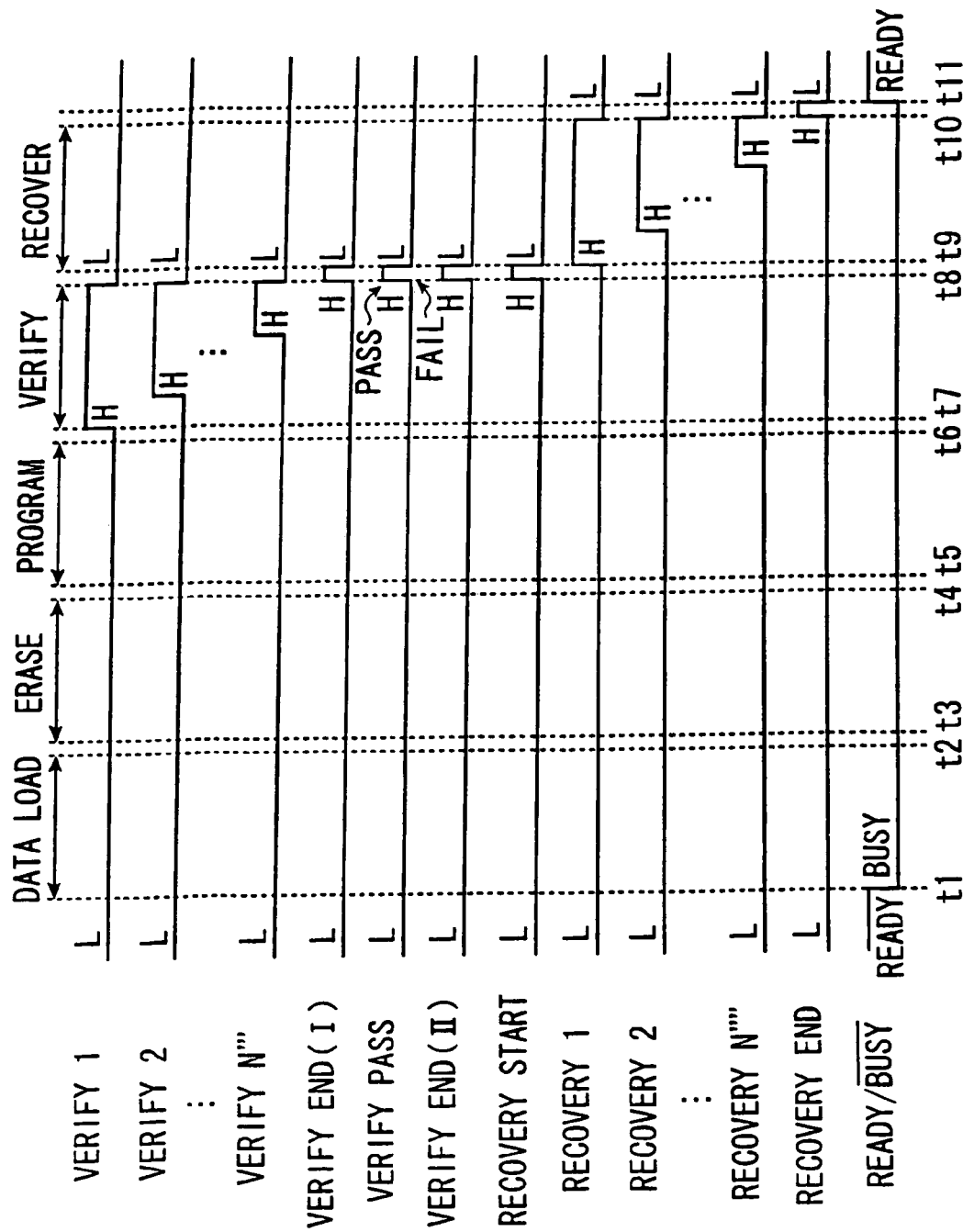
FIG. 13 shows a waveform diagram which indicates a normal operation of the control circuit in FIG. 11.

FIG. 12 and FIG. 13 show waveform diagrams at normal operation of the control circuit illustrated in FIG. 11 respectively. FIG. 2 and FIG. 3 are originally one waveform diagram, which is divided into two waveform diagrams. Therefore, times t1, t2 , , , illustrated in FIG. 12 correspond with times t1, t2 , , , illustrated in FIG. 13, respectively.

As shown in FIG. 11, the control circuit 31 includes a data load control logic 33, a finish logic after data load 35, an erase control logic 37, a program control logic 39, a verify control logic 4, a verify result judgment logic 43 and a recovery control logic 45.

The data load control logic 33 receives the chip enable signal /CE and the write enable signal /WE. When both of the chip enable signal /CE and the write enable signal /WE are set to Low level, a READY//BUSY signal is set from High level to Low level (at time t1 in FIG. 12). The READY//BUSY signal is a signal that indicates whether the nonvolatile semiconductor memory device is a ready state or a busy state. When the READY//BUSY signal is at High level, the READY//BUSY signal indicates the ready state. When the READY//BUSY signal is at Low level, the READY//BUSY signal indicates the busy state.

The data load control logic 33 outputs DATA LOAD 1 to DATA LOAD N signals when both of the chip enable signal /CE and the write enable signal /WE are set to Low level. Each of the DATA LOAD 1 to DATA LOAD N signals is a signal to control timings of N times of data loading. The DATA LOAD 1 to DATA LOAD N signals are typically set from Low level to High level in numerical order (during the time period between t1 and t2 in FIG. 12 (DATA LOAD)). When all of the DATA LOAD 1 to DATA LOAD N are set from High level to Low level, the data load logic 33 outputs a DATA LOAD END signal which is a signal that indicates an end of the data loading operation and is inputted to the finish logic after data load 35.

The finish logic after data load 35 outputs the ERASE START signal which is at High level when the a DATA LOAD END signal is set to High level and the TEST signal is set to Low level. The TEST signal is set to Low level at the normal operation. The ERASE START signal is inputted to the erase control logic 37.

The erase control logic 37 outputs an ERASE 1 to ERASE N' signals when the ERASE START signal is set to High level. Each of the ERASE 1 to ERASE N' signals is a signal to control timings of the N' times of data erasing. The ERASE 1 to ERASE N' are typically set from Low level to High level in numerical order (during the time period between t3 and t4 in FIG. 12 (ERASE)). When all of the ERASE 1 to ERASE N' signals are set from High level to Low level, the erase control logic 37 outputs a ERASE END signal which is a signal that indicates an end of the erasing operation and is inputted to an OR logic gate 38.

The OR logic gate 38 outputs a PROGRAM START signal which is High level when one of an ERASE END signal and a REPROGRAM START signal is set to High level. The PROGRAM START signal is a signal which indicates a start of the programming operation and is inputted to the program control logic 39.

The program control logic 39 outputs PROGRAM 1 to PROGRAM N" signals when the PROGRAMS START signal is set to High level. Each of the PROGRAM 1 to PROGRAM N" signals indicates a signal to control timings of N" times of data programming. The PROGRAM 1 to PROGRAM N" signals are typically set from Low level to High level in numerical order (during the time period between t5 and t6 in FIG. 12 (PROGRAM)). When all of the PROGRAM 1 to PROGRAM N" signals are set from High level to Low level, the program control logic 39 outputs a PROGRAM END signal which is a signal that indicates an end of the programming operation and is inputted to a verify control logic 41.

When the PROGRAM END signal is set to Low level, the verify control logic 41 outputs VERIFY 1 to VERIFY N'" signals. Each of the VERIFY 1 to VERIFY N'" signals indicates a signal to control timings of N'" times of verifying. The VERIFY 1 to VERIFY N'" signals are typically set from Low level to High level in numerical order (during the time period between t7 and t8 in FIG. 13 (VERIFY)). When all of the VERIFY 1 to VERIFY N'" signals are set from High level to Low level, the verify control logic 41 outputs a VERIFY END (I) signal which is a signal that indicates an end of the verifying operation and is inputted to a verify result judgment logic 43.

When both of the VERIFY END (I) signal and a VERIFY PASS signal are set to High level, the verify result judgment logic 43 outputs the VERIFY END (I) of High level. When the VERIFY PASS signal is set to Low level, the verify result judgment logic 43 outputs the PROGRAM START signal of Low level. The PROGRAM START signal indicates a start of a reprogramming operation and is inputted to the OR logic gate 38. When a REPROGRAM START signal is set to High level, the reprogramming operation, which is shown as REPROGRAM in FIG. 12, is carried out. Also, the VERIFY END (II) signal is a signal which indicates an end of the verifying operation at an normal operation and is inputted to the OR logic gate 44.

The OR logic gate 44 outputs a RECOVERY START (I) signal of High level, when one of the VERIFY END (II) signal and the RECOVERY START (II) signal is set to High level. The RECOVERY START (I) signal is a signal which indicates a start of a recovery operation and is inputted to a recovery control logic 45.

When the RECOVERY START (I) signal is set to High level, the recovery control logic 45 outputs RECOVRY 1 to RECOVRY N"" signals. Each of the RECOVRY 1 to RECOVRY N"" signals indicates a signal to control timings of N"" times of recovery. The RECOVRY 1 to RECOVRY N"" signals are typically set from Low level to High level in numerical order (during the time period between t9 and t10 in FIG. 13 (RECOVEY). When all of the RECOVRY 1 to RECOVRY N"" signals are set from High level to Low level, the recovery control logic 45 outputs a RECOVERY END signal which is a signal that indicates an end of the recovery operation. When the RECOVERY END signal is set from High level to Low level, a READY//BUSY signal is set from Low level to High level. As a result, the semiconductor memory device becomes in a halted condition (at a time t11 in FIG. 13).

As stated above, the control circuit 31 makes the semiconductor memory device to carry out the data loading operation, the data erasing operation, the data programming operation and the verifying operation automatically at the normal operation. And after the verifying operation, the semiconductor memory device carries out the recovery operation, then is halted. The verifying operation can be omitted. In this case, after automatically carrying out the data loading operation, the data erasing operation and the data programming operation, the semiconductor memory device carries out the recovery operation and then, becomes in a halted condition.

Testing Operation.

Figure 14:
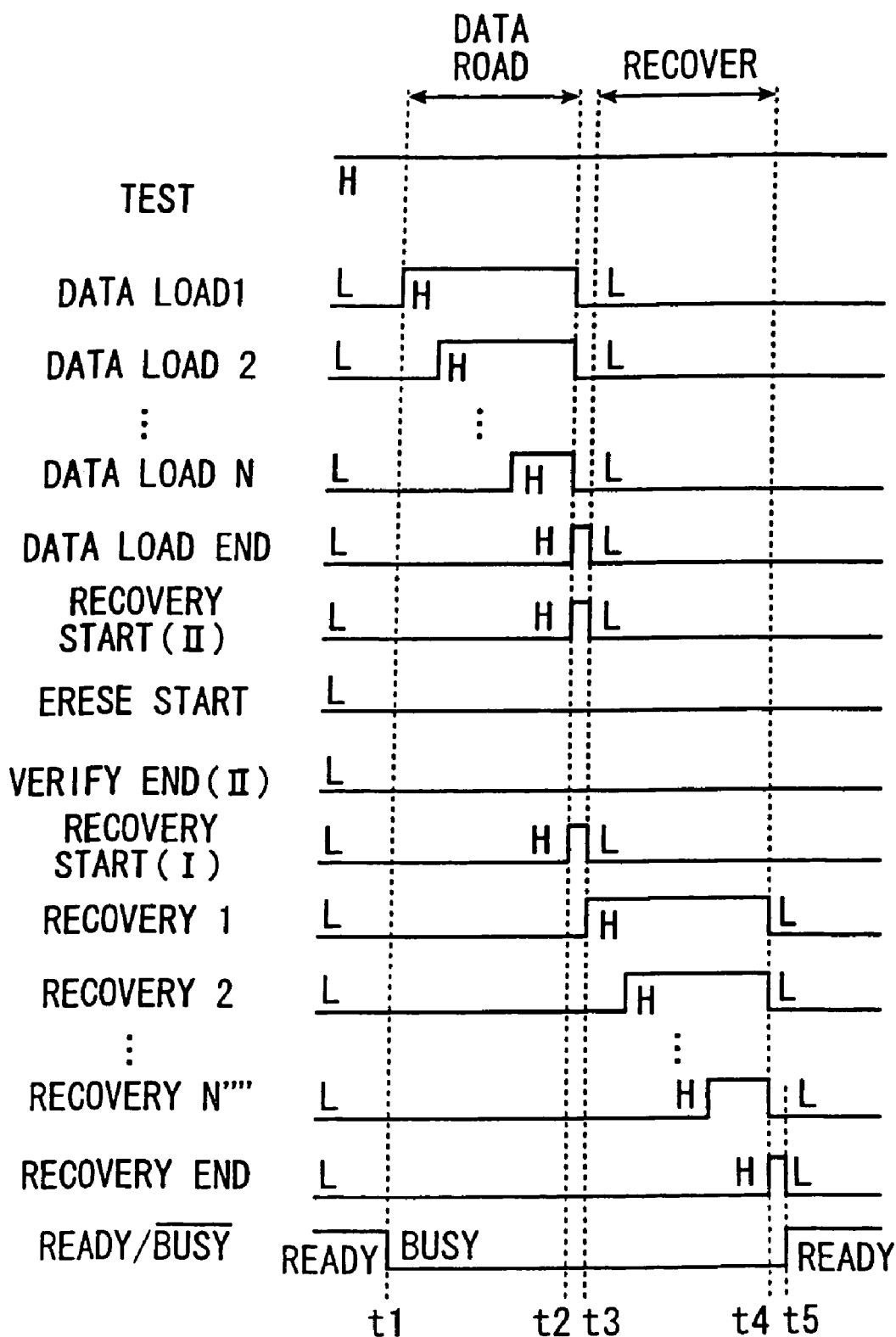
FIG. 14 shows a waveform diagram which indicates a testing operation of the control circuit in FIG. 11.

FIG. 14 shows waveform diagram, which indicates a testing operation of the control circuit 31, illustrated in FIG. 11. A time period between a time t1 and a time t2 in FIG. 14 indicates a period of a data loading operation. Similar to the normal operation, after the data loading operation, the DATA END signal is set to High level. The logic after data load 35 outputs the RECOVERY START (II) of High level, when the DATA LOAD END signal and a TEST signal are set to High level. The TEST signal is set to High level during the testing operation. The RECOVRY START (II) signal is inputted to the OR logic gate 44. Also, the ERASE START signal remains at Low level.

The OR logic gate 44 outputs a RECOVERY START (I) signal of High level, when one of the VERIFY END (II) signal and the RECOVERY START (II) signal is set to High level. The RECOVERY START (I) signal is inputted to a recovery control logic 45. A recovery period between a time t3 and a time t4 in FIG. 14 is a time period while the recovery operation carried out similar to the normal operation. After the recovery operation is ended, the RECOVERY END signal is set to High level then is set to Low level (RECOVERY END). The READY//BUSY signal is set from Low level to High level, and the semiconductor memory device becomes in a halted condition (at a time t5 in FIG. 14).

As stated above, at the testing operation, the control circuit 31 carries out the recovery operation after the data loading operation is ended, and makes the semiconductor memory device become in a halted condition.

Figure 15:
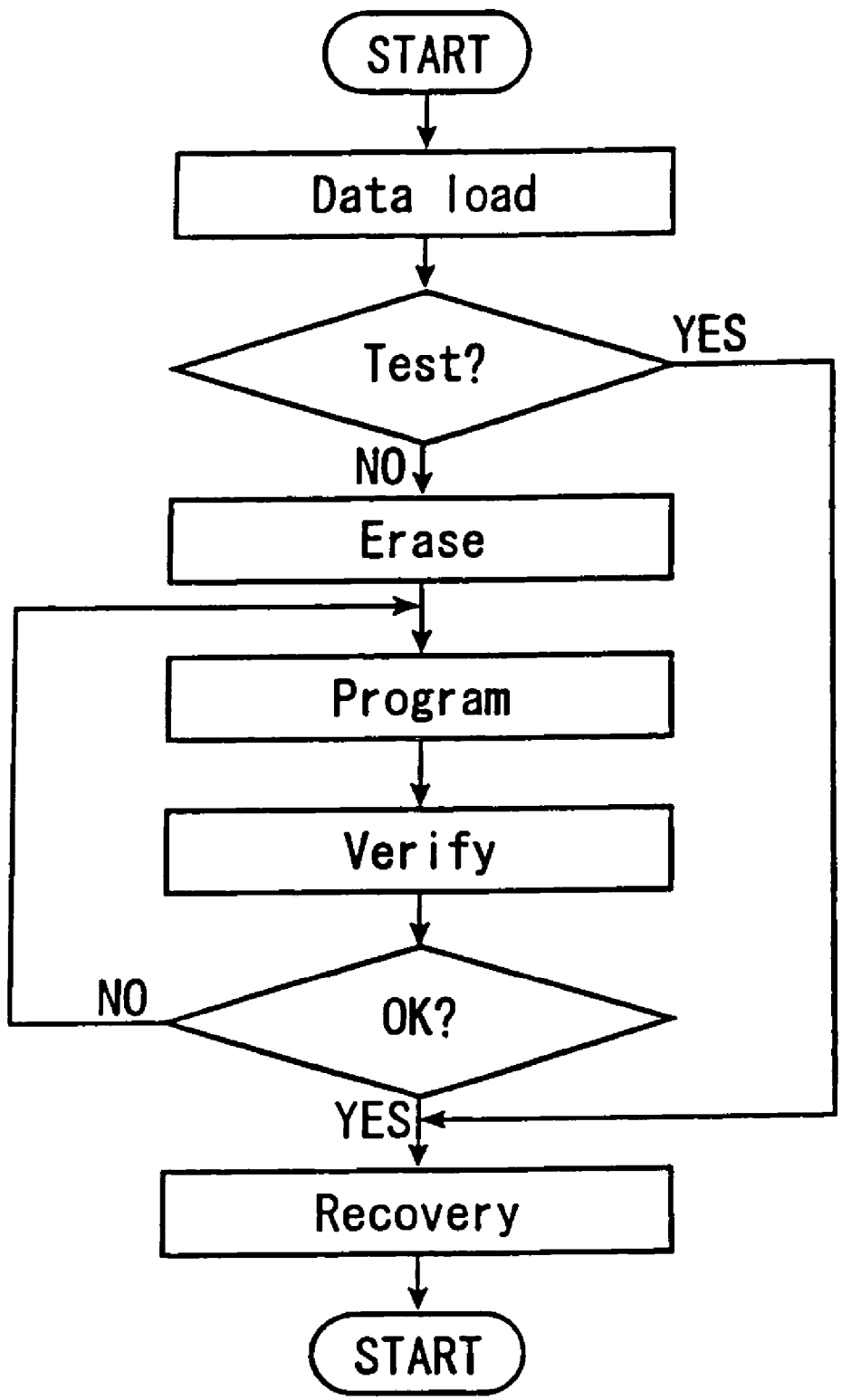
FIG. 15 shows a flow chart which indicates a control sequence of the control circuit.

A specific circuit schematic of the control circuit 31 is not limited to a circuit schematic illustrated in FIG. 11, and any other circuit configurations including a sequence as to be illustrated in FIG. 15 may be used thereto.

Second Embodiment.

Figure 16A:
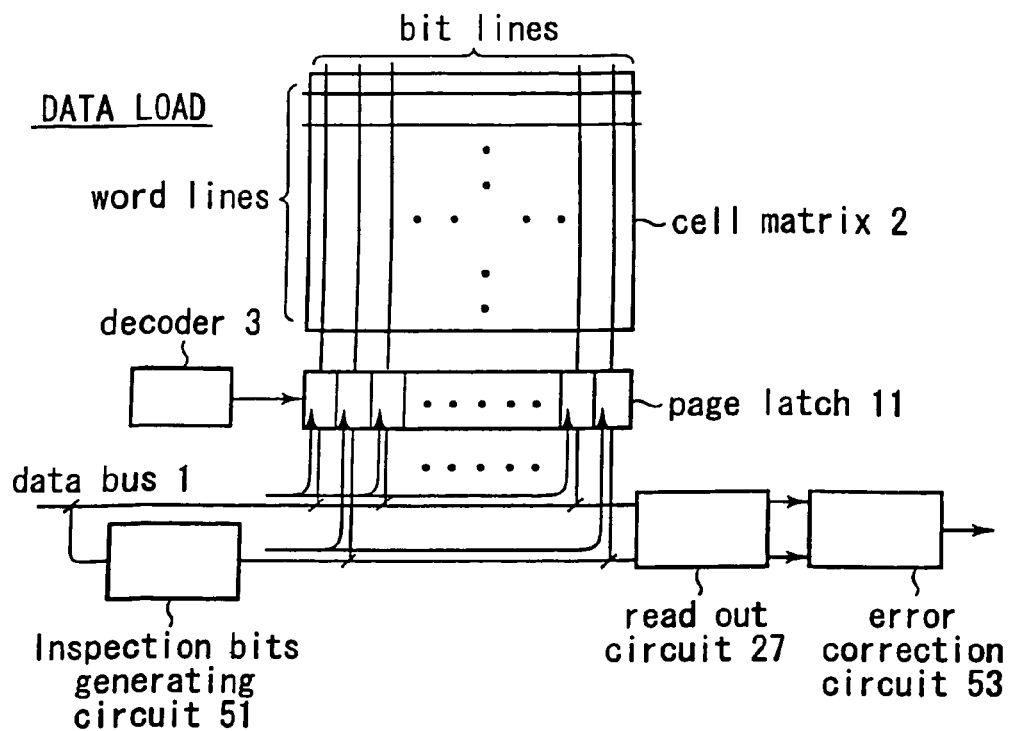
FIG. 16a and FIG. 16b show data flows respectively in a case that a semiconductor memory device of a second embodiment of this invention is set for a data loading operation and a page latch reading out operation.
Figure 16B:
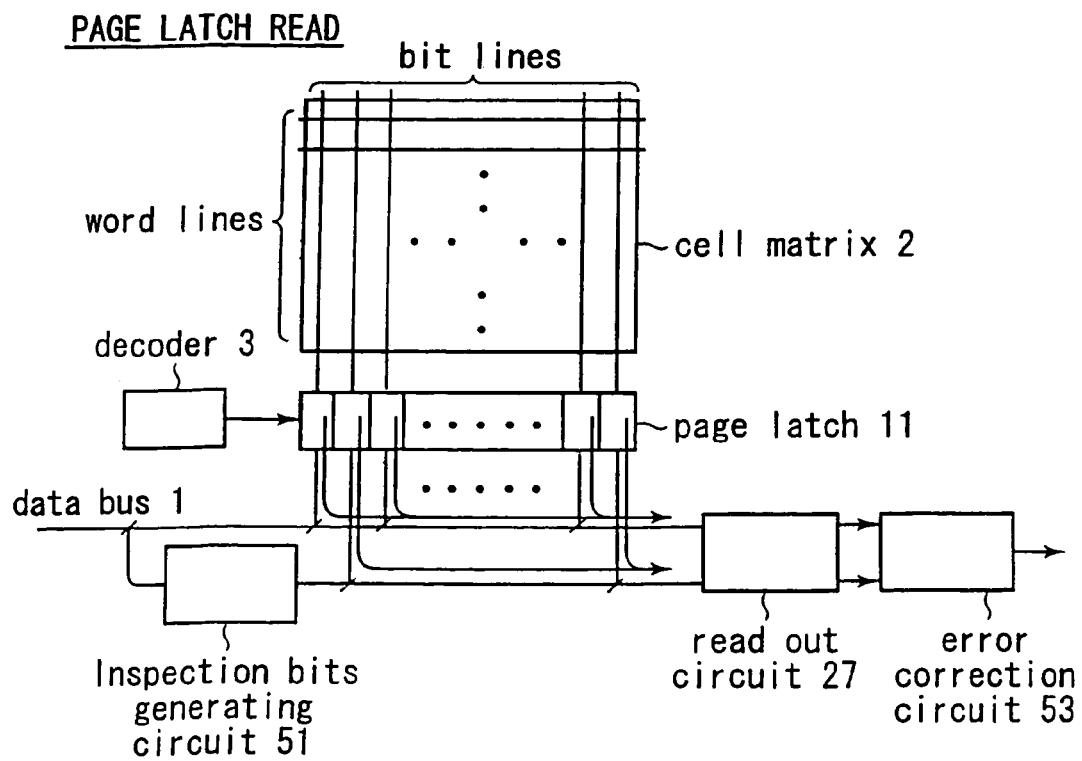

FIG. 16a and FIG. 16b show data flow diagrams at the data loading operation and the page latch reading out operation of a semiconductor memory device of the second embodiment respectively. The semiconductor memory device of the second embodiment differs from the semiconductor memory device of the first embodiment in that an error correction system is provided.

First of all, the error correction system produces an inspection bits from an original data. The inspection bits are produced by an inspection bit generating circuit 51. The inspection bits and the original data are programmed to the corresponding memory cells at the same time. Also, at the reading out operation, the original data and the inspection bits are read out from the memory cells at the same time to judge whether there is an error or not. Data that was judged as an error is corrected and outputted. The judgment of whether there is an error or not, and the error correction if any are carried out at the error correction circuit 53.

When a test and an inspection of the error correction system are carried out, it is necessary that many suspected error correction patterns are inputted to confirm that the error patterns are corrected regularly. Conventionally, it has taken a long time to test and inspect data by the error correction system because the data are programmed to memory calls after data loading. Nevertheless, in the second embodiment of the present invention, as shown in FIG. 16a and FIG. 16b, at a testing operation, after the data loading operation is carried out, an operation of the semiconductor memory device is once stopped. After that, the page latch operation is carried out. This sequence is the same as the operations of the first embodiment.

As a result, the data programming operation to the memory cells can be omitted at the test and inspection operation by the error correction system where it is necessary that many suspected error patterns are inputted. Therefore, in the second embodiment, a time for estimating and testing by the inspection bits generating circuit 51 and the error correction circuit 53 can be shorter than the conventional semiconductor memory device.

Figure 17A:
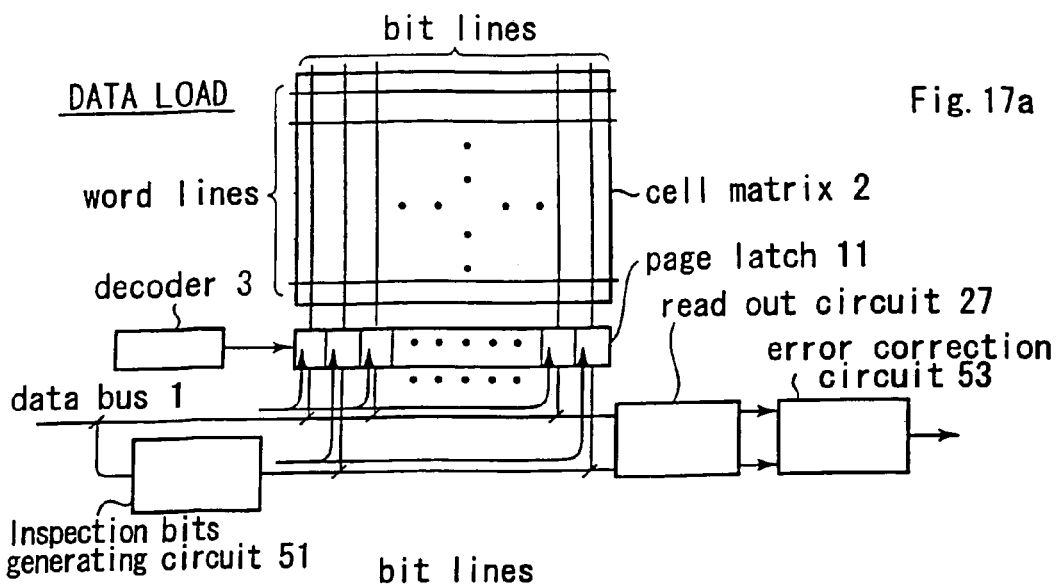
FIG. 17a to FIG. 17c show data flows at the data loading operation and the page latch reading out operation of the second embodiment of this invention respectively.
Figure 17B:
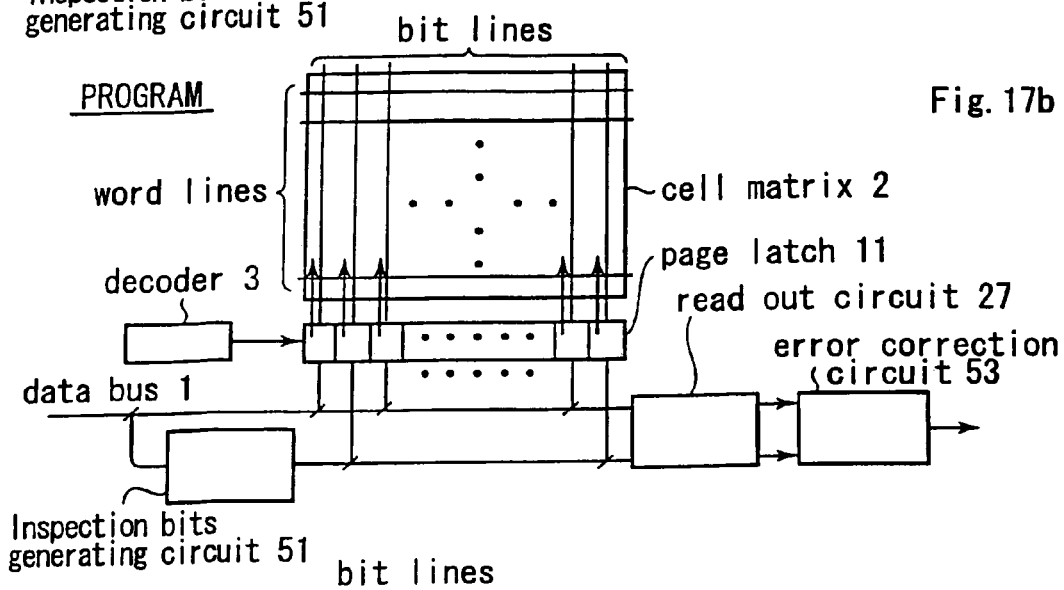
Figure 17C:
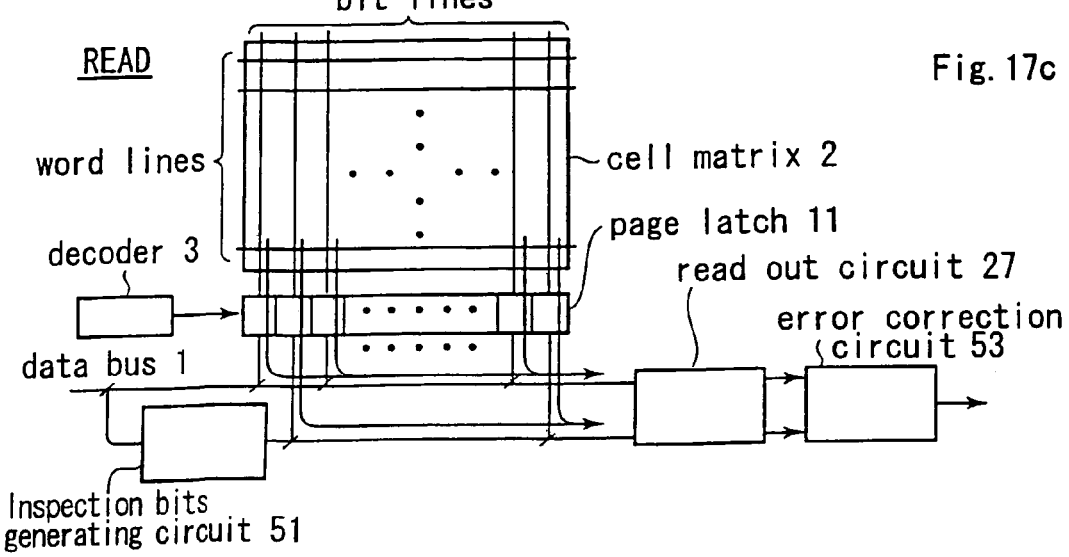

FIG. 17a to FIG. 17c show data flows of the second embodiment of the nonvolatile semiconductor memory device at the normal operation. As shown in FIG. 17a to FIG. 17c, the semiconductor memory device in the second embodiment operates similar to the conventional semiconductor memory device at the normal operation.

Exemplary applications employing the above-described semiconductor memory device are now described.

Figure 19:
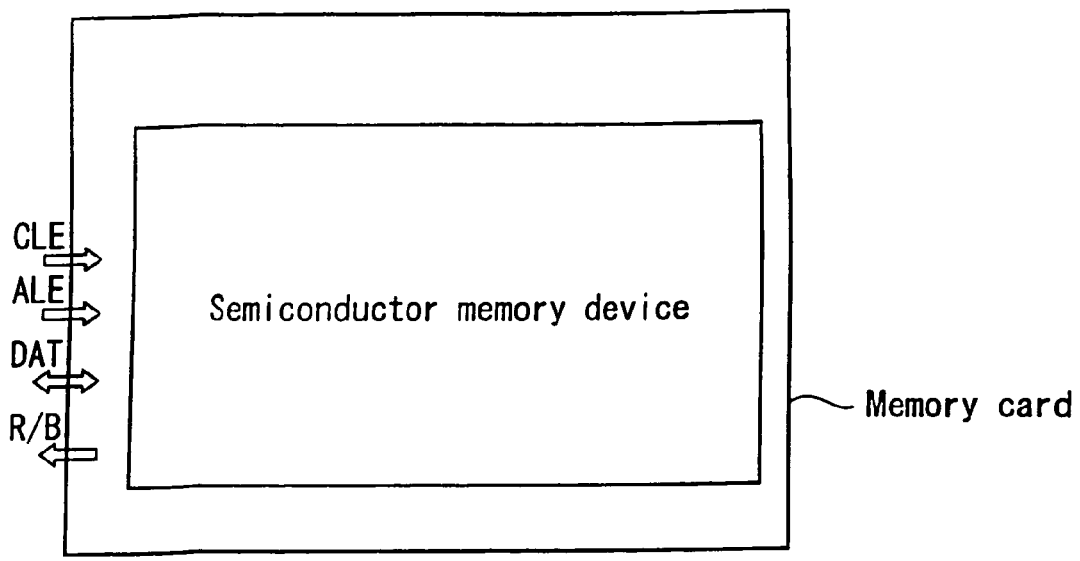
FIGS. 19 and 20 show examples of a memory card.

A memory card having the above mentioned semiconductor memory device is shown in FIG. 19. As shown in FIG. 19, the semiconductor memory device receives/outputs predetermined signals and data from/to an external device (not shown).

A signal line (DAT), a command line enable signal line (CLE), an address line enable signal line (ALE) and ready/busy signal line (R/B) are connected to the memory card having the above mentioned semiconductor memory device. The signal line (DAT) transfers data, address or command signal. The command line enable signal line (CLE) transfers a signal which indicates that a command signal is transferred on the signal line (DAT). The address line enable signal line (ALE) transfers a signal which indicates that an address signal is transferred on the signal line (DAT). The ready/busy signal line (R/B) transfers a signal which indicates whether the memory device is ready or not.

Figure 20:
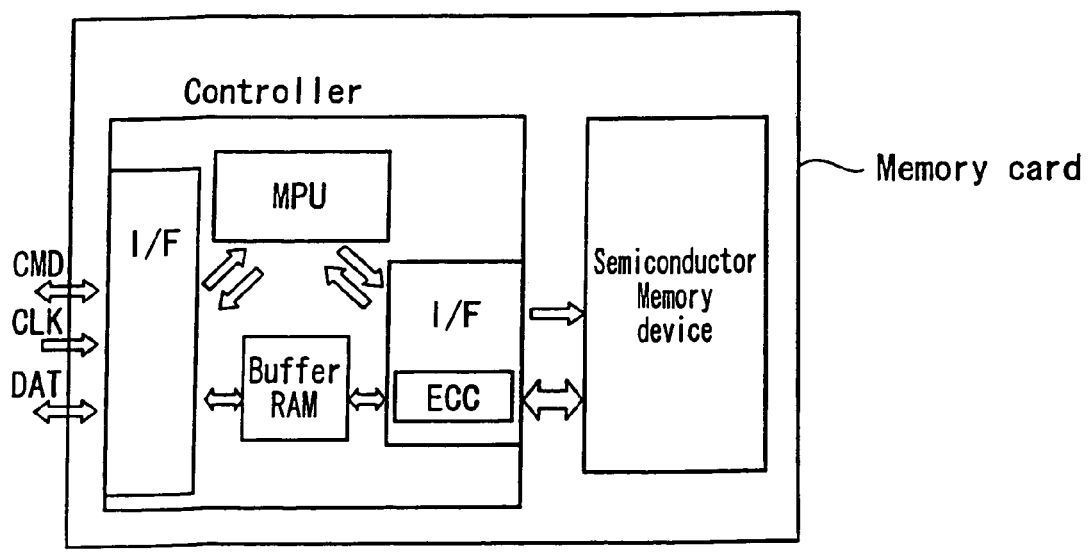

Another example of a memory card is shown in FIG. 20. The memory card shown in FIG. 20 differs from the memory card presented in FIG. 19 in that the memory card includes a controller which controls the semiconductor memory device and receives/transfers predetermined signals from/to an external device (not shown).

The controller includes a interface unit (I/F), a micro processor unit (MPU), a buffer RAM and an error correction code unit (ECC). The interface unit (I/F) receives/outputs predetermined signals from/to an external device (not shown). The micro processor unit converts a logical address into a physical address. The buffer RAM stores temporarily data. The error correction code unit generates an error code. And a command signal line (CMD), a clock signal line (CLK) and a signal line (DAT) are connected to the memory card.

Although memory cards have been described as above, the number of control signal lines, the bit width of the signal line (DAT) and the circuit construction of the controller may be modified while remaining within the scope of the invention.

Figure 21:
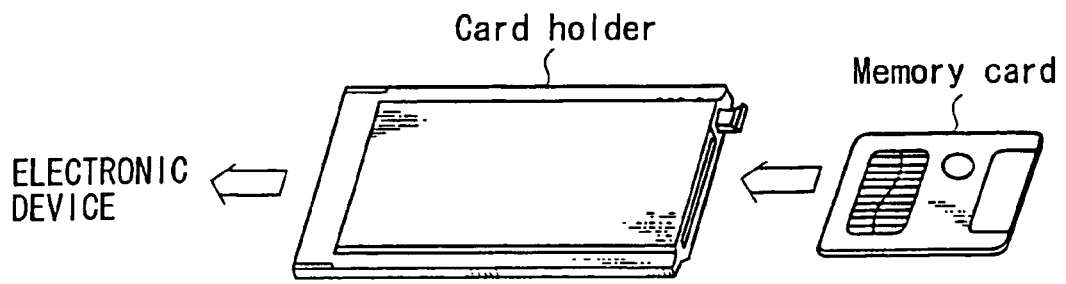
FIG. 21 shows an example of a card holder.

Another application is shown in FIG. 21. A memory card holder to which the memory card is inserted is shown in FIG. 21. And the card holder is connected to electronic device (not shown). The card holder may have a part of the function of the controller.

Figure 22:
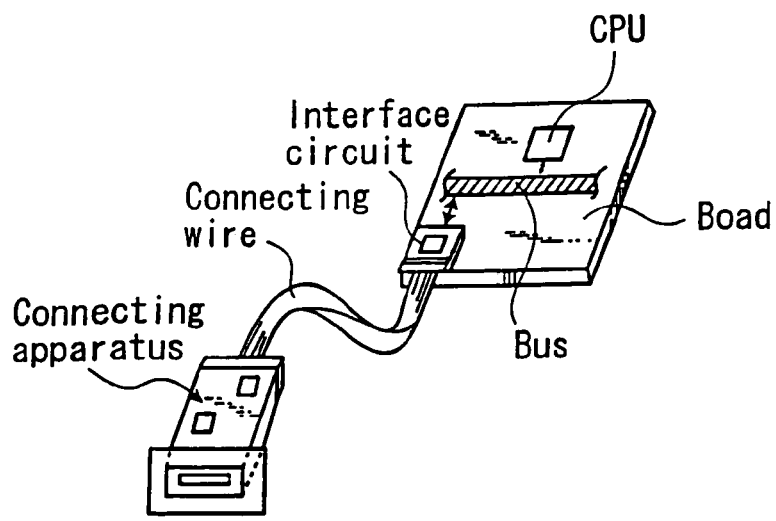
FIGS. 22 and 23 show examples of application of the invention

Still another application is shown in FIG. 22. As shown in FIG. 22, the memory card or the card holder to which the memory card is inserted, is inserted to a connecting apparatus. The connecting apparatus is connected to a board via a connecting wire and an interface circuit. The board has a CPU (Central Processing Unit) and a bus.

Figure 23:
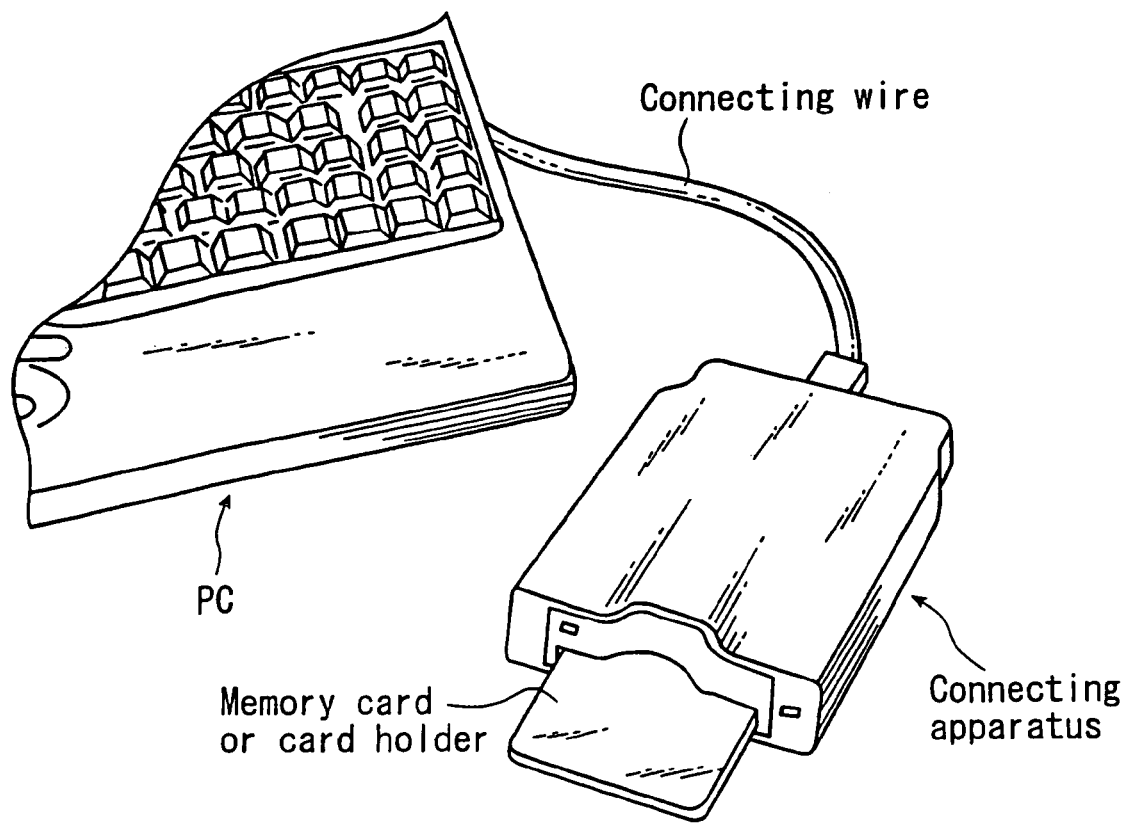

Yet another application is shown in FIG. 23. As shown in FIG. 23, the memory card or the card holder into which the memory card is inserted, is inserted to a connecting apparatus. The connecting apparatus is connected to PC (Personal Computer) via connecting wire.

As explained above, with the present invention, it is possible to provide a semiconductor memory device that is capable of being easy to specify a cause of an error for the case where a reprogrammed data is an error and operating tests of a page latch and a read out circuit at short time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory card apparatus, comprising:
a controller that receives a command signal from an external circuitry,
a semiconductor memory device that includes a memory cell array, a read out circuit, and a plurality of data latch circuits, and operates first, second, and third operation modes in accordance with the command signal transferred from the controller, wherein the first operation mode is configured to transfer a data loaded in the plurality of data latch circuits to the memory cell array, the second operation mode is configured to transfer a data read out from the memory cell array to the read out circuit, and a third operation mode is configured to directly transfer a data loaded in the plurality of data latch circuits to the read out circuit without transferring the data loaded in the plurality of data latch circuits to the memory cell array.

2. The memory card apparatus according to the claim 1, the controller includes a first input/output circuit configured to receive an address signal and a clock signal from the external circuitry, and configured to output a data read out from the memory cell array.

3. The memory card apparatus according to the claim 1, the controller includes a second input/output circuit configured to receive the data read out from the memory cell array.

4. The memory card apparatus according to the claim 1, the controller includes an error correction circuit that corrects an error of data which is read out from the memory cell array.

5. The memory card apparatus according to the claim 1, the controller includes an error correction circuit that corrects an error of data which is input from the external circuitry.

6. The memory card apparatus according to the claim 1, the controller includes a micro processor unit configured to control an operation of the first and second input/output circuits.

7. The memory card apparatus according to the claim 1, the controller includes a buffer circuit that temporally stores the data which is read out from the memory cell array and transferred from the external circuitry.

8. The memory card apparatus according to the claim 1, the memory cell array includes a programmable memory cell.

9. The memory card apparatus according to the claim 1, wherein the third operation mode is performed during a test of the semiconductor memory device.

10. A memory card apparatus, comprising:

a semiconductor memory device configured to be connected to a controller which is arranged in the memory card apparatus, and includes a memory cell array, a read out circuit, and a plurality of data latch circuits, and operates first, second, and third operation modes in accordance with an instruction transferred from the controller, wherein the first operation mode is configured to transfer a data loaded in the plurality of data latch circuits to the memory cell array, the second operation mode is configured to transfer a data read out from the memory cell array to the read out circuit, and a third operation mode is configured to transfer the data loaded in the plurality of data latch circuits to the read out circuit without transferring the data loaded in the plurality of data latch circuits to the memory cell array.

11. The memory card apparatus according to the claim 10, further comprising a controller which includes a first input/output circuit configured to receive an address signal and a clock signal from the external circuitry, and configured to output a data read out from the memory cell array.

12. The memory card apparatus according to the claim 11, the controller includes a second input/output circuit configured to receive the data read out from the memory cell array.

13. The memory card apparatus according to the claim 11, the controller includes an error correction circuit that corrects an error of data which is read out from the memory cell array.

14. The memory card apparatus according to the claim 11, the controller includes an error correction circuit that corrects an error of data which is input from the external circuitry.

15. The memory card apparatus according to the claim 11, the controller includes a micro processor unit configured to control an operation of the first and second input/output circuits.

16. The memory card apparatus according to the claim 11, the controller includes a buffer circuit that temporally stores the data which is read out from the memory cell array and transferred from the external circuitry.

17. The memory card apparatus according to the claim 10, the memory cell array includes a programmable memory cell.

18. The memory card apparatus according to the claim 10, wherein the third operation mode is performed during a test of the semiconductor memory device.

* * * * *